US010601337B2

(12) United States Patent
Tanaka

(10) Patent No.: US 10,601,337 B2
(45) Date of Patent: Mar. 24, 2020

(54) SEMICONDUCTOR DEVICE AND POWER CONVERSION DEVICE

(71) Applicant: Mitsubishi Electric Corporation, Tokyo (JP)

(72) Inventor: Kan Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/845,012

(22) Filed: Dec. 18, 2017

(65) Prior Publication Data

US 2018/0331631 A1 Nov. 15, 2018

(30) Foreign Application Priority Data

May 15, 2017 (JP) ................................. 2017-096561

(51) Int. Cl.
*H01L 21/761* (2006.01)
*H01L 27/06* (2006.01)
(Continued)

(52) U.S. Cl.
CPC ............ *H02M 7/48* (2013.01); *H01L 21/761* (2013.01); *H01L 21/8234* (2013.01);
(Continued)

(58) Field of Classification Search
CPC ... H01L 21/761; H01L 27/0888; H01L 29/06; H02M 7/12
See application file for complete search history.

(56) References Cited

U.S. PATENT DOCUMENTS 6,603,176 B2 * 8/2003 Akiyama .......... H01L 21/76264
257/351
2004/0232522 A1 * 11/2004 Shimizu ................ H01L 21/763
257/548
(Continued)

FOREIGN PATENT DOCUMENTS

JP 4574601 B2 11/2010

OTHER PUBLICATIONS

An Office Action mailed by the German Patent and Trademark Office dated Aug. 23, 2018, which corresponds to German Patent Application No. 102018200628.8 and is related to U.S. Appl. No. 15/845,012.
(Continued)

*Primary Examiner* — Kenneth Parker
*Assistant Examiner* — Long H Le
(74) *Attorney, Agent, or Firm* — Studebaker & Brackett PC

(57) ABSTRACT

A semiconductor device includes a P-type low potential region, an N-type first region, an N-type second region, an N-type third region, an annular trench, and a P-type isolation region. The N-type first region is provided on the principal surface of a P-type SOI layer provided to a P-type SOI substrate. The N-type first region has a concave portion. The N-type third region is provided inside the concave portion of the N-type first region so as to be away from the edge of the concave portion. A level-shift device is formed on the surface of the N-type third region. The P-type isolation region is a slit region extending in U-shape along the boundary between the N-type third region and the concave portion of the N-type first region.

19 Claims, 20 Drawing Sheets

(51) Int. Cl.

| | | |
|---|---|---|
| *H02M 7/12* | (2006.01) | |
| *H02M 7/48* | (2007.01) | |
| *H01L 21/8234* | (2006.01) | |
| *H01L 29/06* | (2006.01) | |
| *H01L 29/786* | (2006.01) | |
| *H01L 27/088* | (2006.01) | |
| *H01L 29/861* | (2006.01) | |
| *H01L 29/40* | (2006.01) | |
| *H01L 29/78* | (2006.01) | |
| *H02M 7/5387* | (2007.01) | |

(52) U.S. Cl.
CPC .......... *H01L 27/088* (2013.01); *H01L 29/06* (2013.01); *H01L 29/402* (2013.01); *H01L 29/404* (2013.01); *H01L 29/786* (2013.01); *H01L 29/7824* (2013.01); *H01L 29/78624* (2013.01); *H01L 29/8611* (2013.01); *H02M 7/12* (2013.01); *H01L 29/063* (2013.01); *H01L 29/0649* (2013.01); *H01L 29/0653* (2013.01); *H01L 29/0692* (2013.01); *H02M 7/53875* (2013.01)

(56) References Cited

U.S. PATENT DOCUMENTS

| | | | |
|---|---|---|---|
| 2005/0056906 A1 | 3/2005 | Jimbo et al. | |
| 2005/0179089 A1* | 8/2005 | Shimizu | H01L 21/761 |
| | | | 257/358 |
| 2009/0256234 A1* | 10/2009 | Shimizu | H01L 21/84 |
| | | | 257/516 |
| 2016/0056282 A1* | 2/2016 | Yamaji | H03K 17/002 |
| | | | 257/337 |
| 2018/0026134 A1* | 1/2018 | Eikyu | H01L 29/7835 |

OTHER PUBLICATIONS

T. Terashima et al., "A New Level-shifting Technique by divided RESURF Structure", International Symposium on Power Semiconductor Devices & IC's, May 26-29, 1997, pp. 57-60.

K. Shimizu et al., "The 2nd Generation divided RESURF structure for High Voltage ICs", International Symposium on Power Semiconductor Devices & IC's, May 18-22, 2008, pp. 311-314, Orlando, Florida.

* cited by examiner

*Related Art*

SEMICONDUCTOR DEVICE AND POWER CONVERSION DEVICE

FIELD

The present application relates to a semiconductor device, a semiconductor device manufacturing method and a power conversion device.

BACKGROUND

A level-shift semiconductor device having a so-called divided RESURF (Reduced Surface Field) structure has been hitherto known, for example, as disclosed in Japanese Patent No. 4,574,601. The divided RESURF structure is related to a technique in which a high withstand-voltage level-shift device to which a well-known RESURF structure is applied is formed in a high withstand-voltage isolation region to which a well-known RESURF structure is applied. Since the RESURF structure is a well-known structure as described in Japanese Patent No. 4,574,601, etc., the description thereof is omitted. In the divided RESURF structure disclosed in this patent literature, each of the high withstand-voltage isolation region and the high withstand-voltage level-shift device is formed of an N-type diffusion layer. The high withstand-voltage level-shift device and the high withstand-voltage isolation region are electrically isolated from each other by a P-type isolation region.

SUMMARY

FIG. 22 is a plan view showing a semiconductor device 201 according to a related art related to the present application. FIG. 22 shows an example of a semiconductor device 201 having a level-shift device 220, and the semiconductor device 201 is a gate driver IC for driving a power device. The semiconductor device 201 includes a P-type low potential region 82 using the ground as reference potential, an N-type high potential region 83b using high potential of an output unit as a reference, an N-type high withstand-voltage isolation region 83a for electrically isolating the low potential region 82 and the high potential region 83b from each other, a level-shift device 220 for transmitting a signal from the low potential region 82 to the high potential region 83b, a high potential wire 222 and a device electrode 221. The level-shift device 220 is formed in an N-type region which is provided at a part of the low potential region 82. The high potential region 83b and the high withstand-voltage isolation region 83a are separated by an annular high potential side electrode 81e. A ground electrode 24 is provided on the low potential region 82 so as to surround the high withstand-voltage isolation region 83a. The device electrode 221 of the level-shift device 220 is connected to the high potential region 83b via the high potential wire 222.

Since the level-shift device 220 is provided outside the outer periphery of the high withstand-voltage isolation region 83a in the semiconductor device 201 shown in FIG. 22, the high withstand-voltage isolation region 83a and the level-shift device 220 are far away from each other in an in-plane direction, which causes increase of chip size. A divided RESURF structure according to the foregoing Japanese Patent No. 4,574,601 can be used as a technique of preventing increase of the chip size as described above. According to the divided RESURF structure, the chip size can be dramatically reduced as compared with a case where the high withstand-voltage isolation region and the high withstand-voltage level-shift device are independently formed at separate places as shown in FIG. 22. Furthermore, there is also an advantage that the high potential wire 222 is unnecessary. However, when the chip size is reduced by providing the level-shift device in the divided RESURF structure, the level-shift device is formed so as to straddle the low potential region, the high potential region and the high withstand-voltage isolation region. In order to prevent a malfunction of the level shift device, it is important to ensure electrical isolation of each region.

The present application has been implemented to solve the foregoing problem, and has an object to make reduction in chip size and ensuring electrical isolation compatible with each other in a semiconductor device which includes a high withstand-voltage isolation region between a low potential region and a high potential region and has a level-shift function from the low potential region to the high potential region.

Another object of the present application is to provide a manufacturing method suitable to manufacture the semiconductor device described above, and a power conversion device in which the semiconductor device is utilized.

A semiconductor device according to the present application includes: a P-type SOI substrate; an N-type first region; an annular trench; an N-type second region; an N-type third region; and a P-type isolation region. The P-type SOI substrate has an insulating layer and a P-type SOI layer laminated on the insulating layer. The N-type first region is provided on a principal surface of the P-type SOI layer and has a concave portion at which a part of a peripheral edge of the N-type first region is concaved in a plane direction of the principal surface of the P-type SOI layer in plan view of the principal surface of the P-type SOI layer. The annular trench is annularly provided in a center region of the first region in plan view of the principal surface of the P-type SOI layer so as to reach the insulating layer, and filled with an insulating material therein. The N-type second region is provided inside the annular trench in plan view of the principal surface of the P-type SOI layer. The N-type third region is provided inside the concave portion of the first region so as to be away from an edge of the concave portion in plan view of the principal surface of the P-type SOI layer, and in which a level-shift device is formed. The P-type isolation region extends along a boundary between the third region and the concave portion of the first region in plan view of the principal surface of the P-type SOI layer, and includes a first isolation portion interposed between the second region and the third region, and a second isolation portion interposed between the first region and the third region.

A power conversion device according to the present application includes: a main conversion circuit; a driving circuit; and a control circuit for outputting a control signal for controlling the driving circuit to the driving circuit. The driving circuit contains a semiconductor device. The semiconductor device includes: a P-type SOI substrate; an N-type first region; an annular trench; an N-type second region; an N-type third region; and a P-type isolation region. The P-type SOI substrate has an insulating layer and a P-type SOI layer laminated on the insulating layer. The N-type first region is provided on a principal surface of the P-type SOI layer and has a concave portion at which a part of a peripheral edge of the N-type first region is concaved in a plane direction of the principal surface of the P-type SOI layer in plan view of the principal surface of the P-type SOI layer. The annular trench is annularly provided in a center region of the first region in plan view of the principal surface of the P-type SOI layer, an inside of the annular trench being filled with an insulating material and reaching the insulating layer. The N-type second region is provided inside the annular trench in plan view of the principal surface of the P-type SOI layer. The N-type third region is provided inside the concave portion of the first region so as to be away from an edge of the concave portion in plan view of the principal surface of the P-type SOI layer, and in which a level-shift device is formed. The P-type isolation region extends along a boundary between the third region and the concave portion of the first region in plan view of the principal surface of the P-type SOI layer, and includes a first isolation portion interposed between the second region and the third region, and a second isolation portion interposed between the first region and the third region. The P-type isolation region extends along a boundary between the third region and the concave portion of the first region and includes a first isolation portion interposed between the second region and the third region and a second isolation portion interposed between the first region and the third region. The driving circuit performs level shift on the control signal by the level-shift device to generate the driving signal.

A method of manufacturing a semiconductor device according to the present application comprising the steps of: preparing a P-type SOI substrate; providing an N-type buried region to a part of the P-type SOI layer; laminating a P-type semiconductor layer on the P-type SOI layer and the N-type buried region; providing an N-type diffusion region on a principal surface of the P-type semiconductor layer; providing an annular trench in a center region of the first diffusion region in plan view of the principal surface of the P-type semiconductor layer; providing an N-type third diffusion region inside the concave portion of the first diffusion region; and forming a level-shift device in the third diffusion region. The P-type SOI substrate has an insulating layer and a P-type SOI layer laminated on the insulating layer. The N-type diffusion region has a concave portion at which a part of a peripheral edge of the N-type diffusion region is concaved in a plane direction of the principal surface of the P-type semiconductor layer in plan view of the principal surface of the P-type semiconductor layer. The concave portion is positioned on the N-type buried region. The annular trench is provided so that the annular trench reaches the insulating layer and is buried with an insulating material, thereby defining a second diffusion region inside the annular trench. The N-type third diffusion region is provided so that the N-type third diffusion region is away from an edge of the concave portion in plan view of the principal surface, thereby providing a P-type isolation region that extends along a boundary between the third diffusion region and the concave portion of the first diffusion region, and is formed of the P-type semiconductor layer.

Other and further objects, features and advantages of the invention will appear more fully from the following description.

DESCRIPTION OF EMBODIMENTS

First Embodiment

Figure 1:
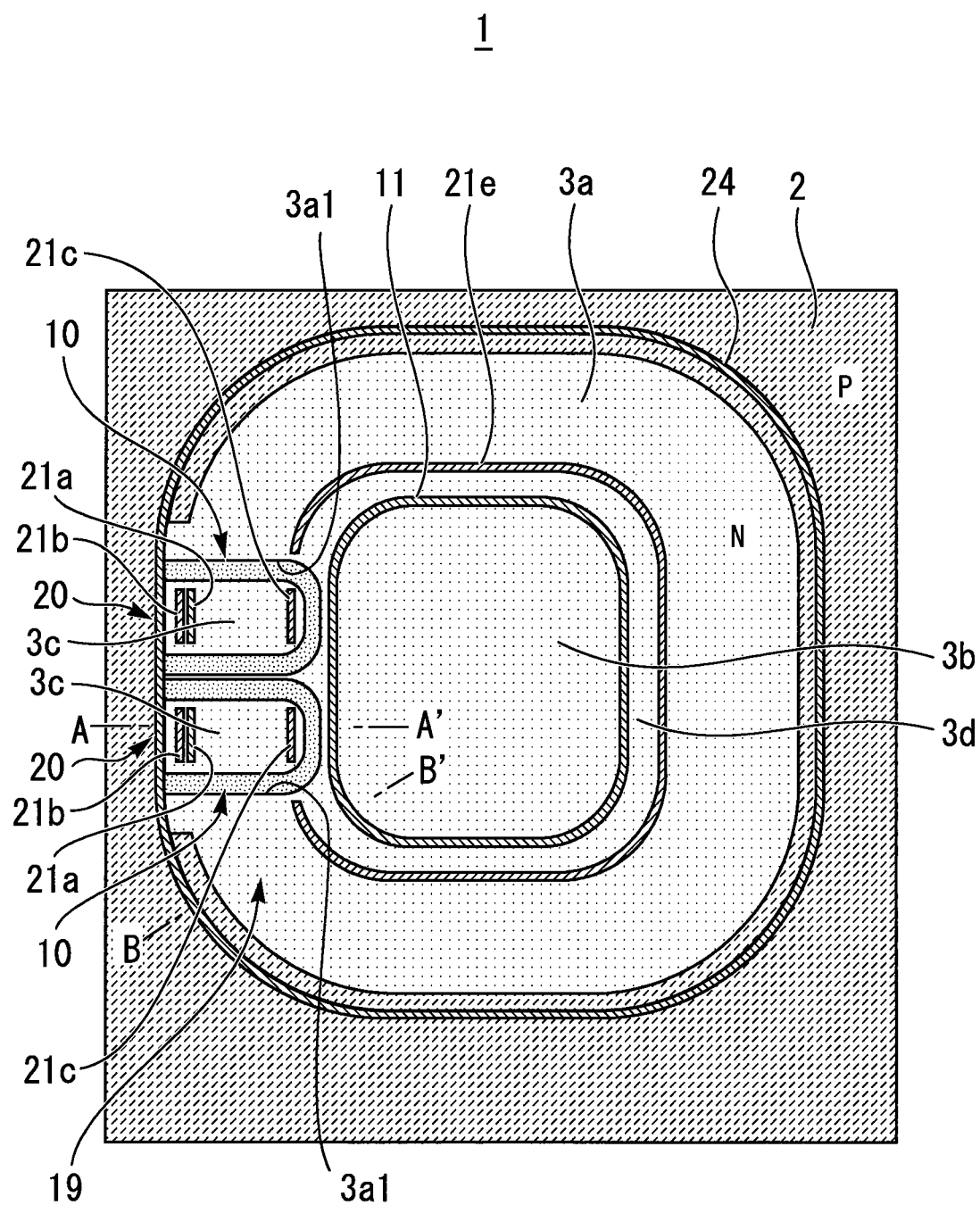
FIG. 1 is a plan view showing a semiconductor device according to a first embodiment of the present application.
Figure 2:
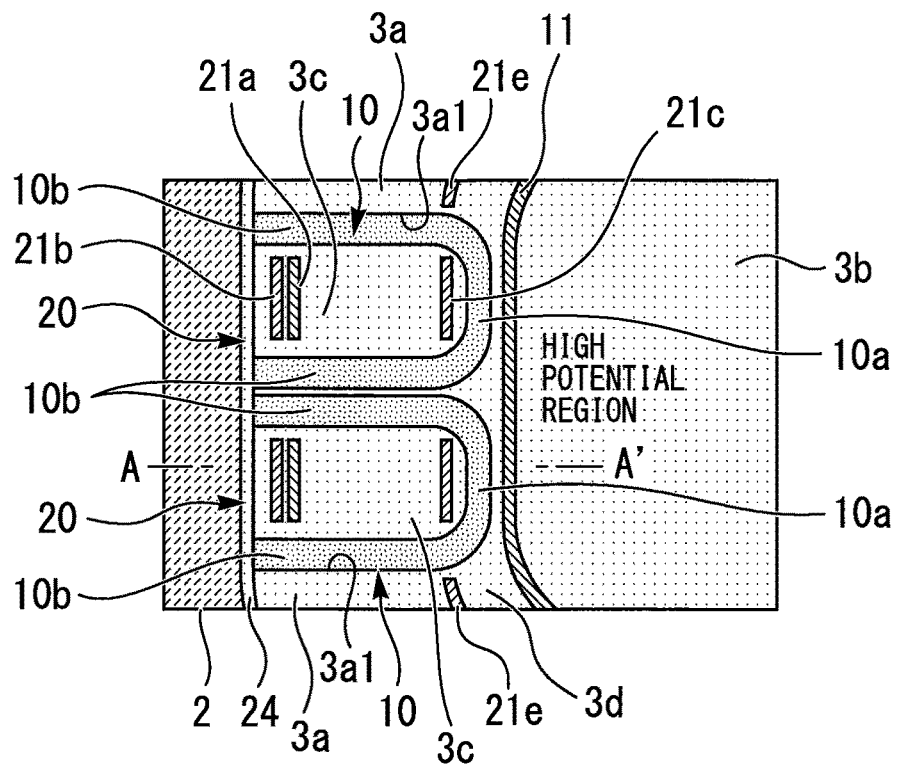
FIG. 2 is a partially enlarged plan view of the semiconductor device according to the first embodiment of the present application.
Figure 3:
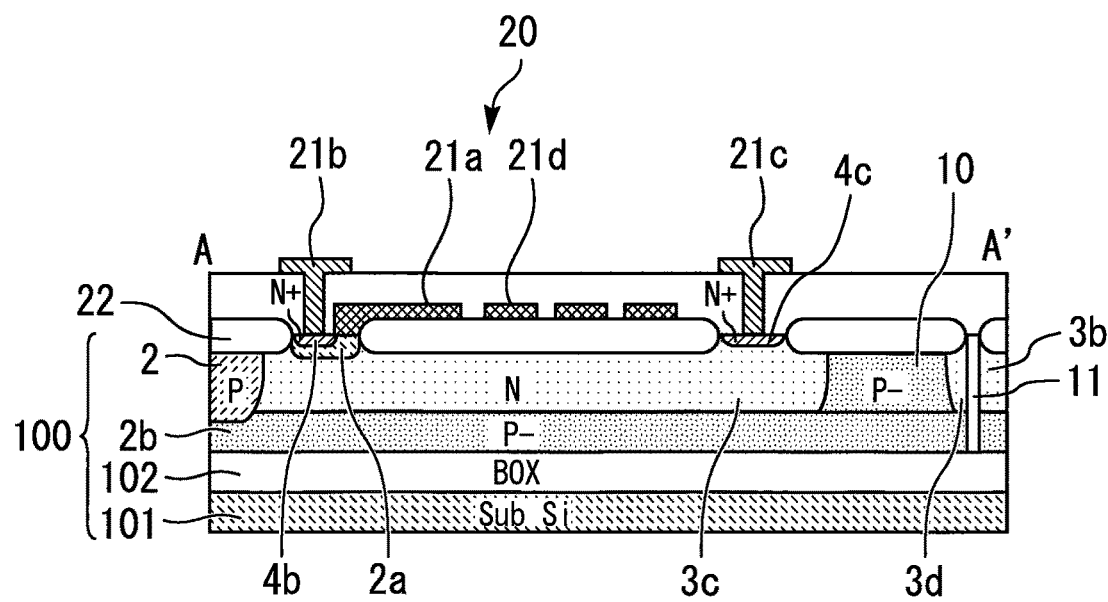
FIG. 3 is a cross-sectional views of the semiconductor device according to the first embodiment of the present application.
Figure 4:
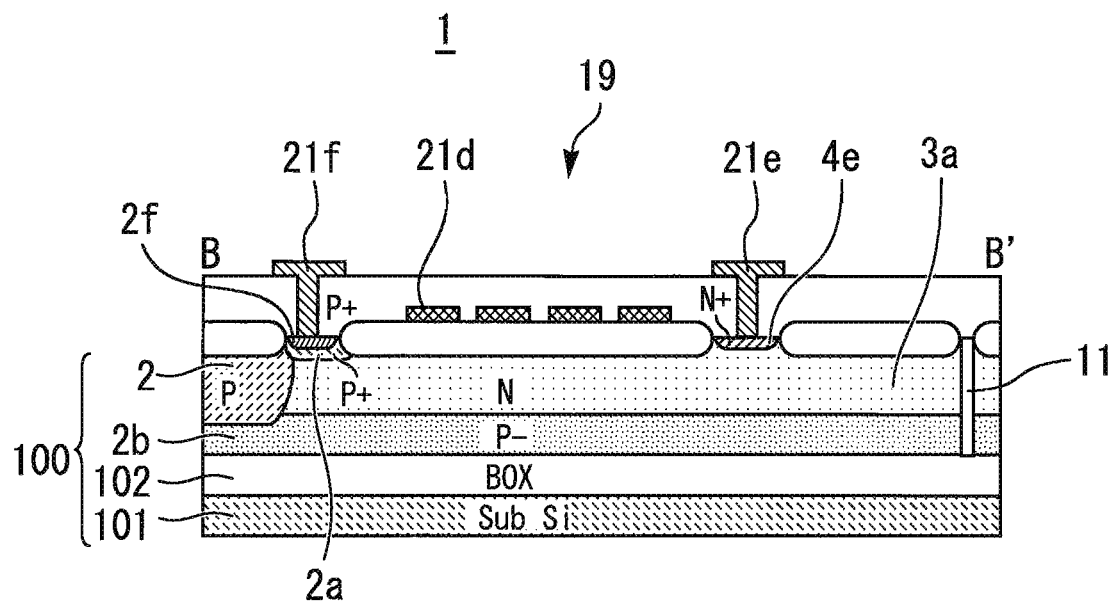
FIG. 4 is a cross-sectional views of the semiconductor device according to the first embodiment of the present application.

FIG. 1 is a plan view showing a semiconductor device 1 according to a first embodiment of the present application. FIG. 2 is a partially enlarged plan view of the semiconductor device 1 according to the first embodiment of the present application, and also is an enlarged view of the vicinity of a level-shift device 20 of the semiconductor device 1. FIGS. 3 and 4 are cross-sectional views of the semiconductor device 1 according to the first embodiment of the present application. Particularly, FIG. 3 is a cross-sectional view of the semiconductor device 1 which is taken along line A-A' of FIG. 1, and FIG. 4 is a cross-sectional view of the semiconductor device 1 which is taken along line B-B' of FIG. 1.

As shown in the cross-sectional views of FIGS. 3 and 4, the semiconductor device 1 has a P-type SOI (Silicon On Insulator) substrate 100. The P-type SOI substrate 100 includes a silicon substrate 101 as a support substrate, a BOX layer 102 provided on the silicon substrate 101, and a P-type SOI layer 2b laminated on the BOX layer 102. The BOX layer 102 is an insulating layer formed of a buried oxide film (Buried Oxide: BOX). P-type SOI layer 2b is a P-type semiconductor layer.

The planar structure of the semiconductor device 1 will be described by using the plan view of FIG. 1. The plan view of FIG. 1 shows a principal surface of the semiconductor device 1. The semiconductor device 1 includes a P-type low potential region 2, an N-type first region 3a, an N-type second region 3b, an N-type third region 3c, an annular trench 11 and a P-type isolation region 10. The P-type low potential region 2 is provided on the principal surface of the P-type SOI layer 2b as shown in the cross-sectional views of FIGS. 3 and 4. The P-type low potential region 2 has a higher impurity concentration than the P-type SOI layer 2b. The N-type first region 3a is provided on the principal surface of the P-type SOI layer 2b as shown in the cross-sectional views of FIGS. 3 and 4. The N-type first region 3a has a concave portion 3a1. The concave portion 3a1 is formed by concaving a part of the peripheral edge of the N-type first region 3a in a direction to the plane of the principal surface (hereinafter referred to as "a plane direction of the principal surface") of the semiconductor device 1 in the plan view of FIG. 1. The N-type first region 3a serves as a "high withstand-voltage isolation region". A diode 19 is formed in the N-type first region 3a.

The annular trench 11 is annularly provided in a center region of the N-type first region 3a in plan view of FIG. 1. The inside of the annular trench 11 is filled with an insulating material. The annular trench 11 extends to the BOX layer 102 as shown in the cross-sectional views of FIGS. 3 and 4. The N-type second region 3b is provided inside the annular trench 11 in plan view of FIG. 1. The N-type second region 3b serves as a "high potential region".

In the plan view of FIG. 1, the N-type third region 3c is provided inside the concave portion 3a1 of the N-type first region 3a so as to be away from the edge of the concave portion 3a1. A level-shift device 20 is formed on the surface of the N-type third region 3c. The level-shift device 20 includes a gate electrode 21a, a source electrode 21b and a drain electrode 21c. The source electrode 21b is located on a low potential side, and the drain electrode 21c is located on a high potential side. The low potential side is a side nearer to the P-type low potential region 2, and the high potential side is a side nearer to the N-type second region 3b which is the high potential region. In the plan view of FIG. 1, the P-type isolation region 10 is a slit-shaped region which extends in U-shape along the boundary between the N-type third region 3c and the concave portion 3a1 of the N-type first region 3a. The P-type isolation region 10 is a P-type semiconductor layer which is uniform and has high resistance.

In the first embodiment, the N-type first region 3a has plural concave portions 3a1 which are adjacent to one another. Each of the plural concave portions 3a1 is provided with a P-type isolation region 10, an N-type third region 3c and a level-shift device 20.

As shown in a partially enlarged plan view of FIG. 2, the P-type isolation region 10 has a first isolation portion 10a and second isolation portions 10b. The first isolation portion 10a extends along the boundary between the N-type second region 3b and the N-type third region 3c, and electrically isolates the N-type second region 3b and the N-type third region 3c from each other. The second isolation portion 10b extends along the boundary between the N-type first region 3a and the N-type third region 3c, and electrically isolates the N-type first region 3a and the N-type third region 3c from each other.

As shown in plan view of FIG. 1, a ground electrode 24 surrounding the outer periphery of the N-type first region 3a and a cathode electrode 21e surrounding the annular trench 11 are provided on the P-type low potential region 2. The gap between the annular trench 11 and the cathode electrode 21e is referred to as "N-type region 3d".

The cross-sectional structure of the semiconductor device 1 will be described in detail. FIG. 3 shows the cross-sectional structure of the level-shift device 20. The level-shift device is a high withstand-voltage N channel MOSFET. A gate electrode 21a and a field plate 21d are positioned on the N-type third region 3c with an insulating film 22 interposed therebetween. A first P$^+$-type well 2a is provided on the surface of the N-type third region 3c. A first N$^+$-type well 4b is further provided on the surface of the first P$^+$-type well 2a. The source electrode 21b is connected to the first N$^+$-type well 4b. The drain electrode 21c is connected to a second N$^+$-type well 4c provided on the surface of the N-type third region 3c. When a voltage applied to the gate electrode 21a is an off-voltage, the low potential side and the high potential side are isolated from each other by a reverse diode structure. When the voltage applied to the gate electrode 21a is an on-voltage, a signal is transmitted from the low potential side to the high potential side.

FIG. 4 shows the cross-sectional structure of the diode 19. The field plate 21d is positioned on the N-type first region 3a with the insulating film 22 interposed therebetween. A first P$^+$-type well 2a is provided on the surface of the N-type first region 3a, and a second P$^+$-type well 2f is further provided on the surface of the first P$^+$-type well 2a. The anode electrode 21f is connected to the second P$^+$-type well 2f. The cathode electrode 21e is connected to a third N$^+$-type well 4e provided on the surface of the N-type first region 3a. As not shown in plan view of FIG. 1, the anode electrode 21f is actually connected to the ground electrode 24 of the P-type low potential region 2. A high potential VB is applied to the cathode electrode 21e. The low potential side and the high potential side are electrically isolated from each other by the reverse diode structure as described above.

Figure 5:
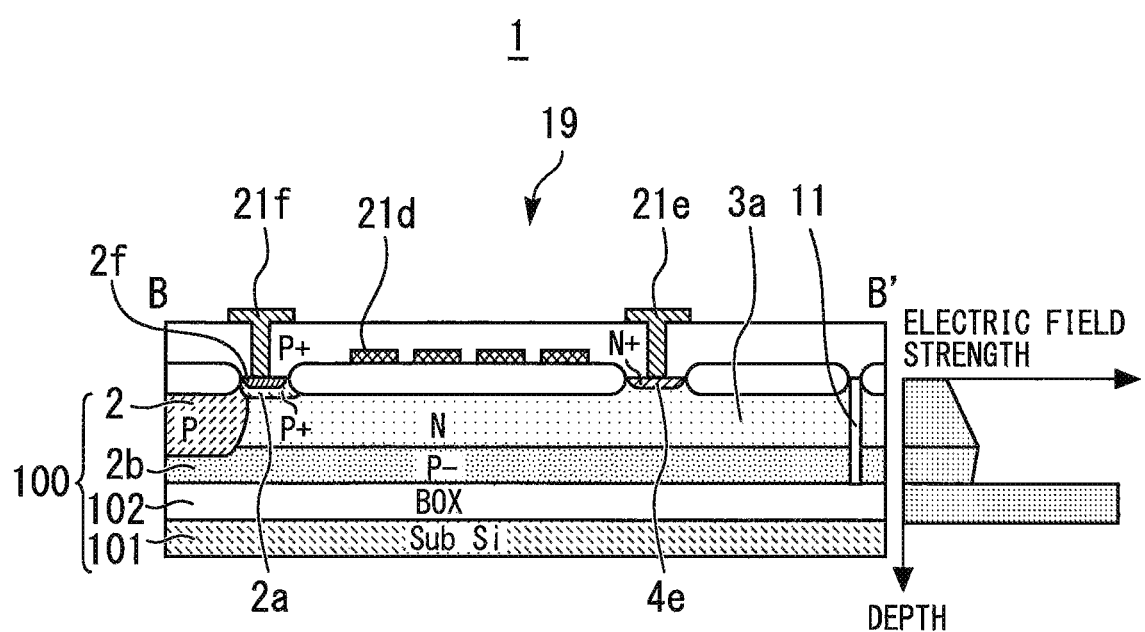
FIG. 5 is a diagram showing the operation of the semiconductor device according to the first embodiment of the present application.

FIG. 5 is a diagram showing the operation of the semiconductor device 1 according to the first embodiment of the present application. Since the semiconductor device 1 according to the first embodiment has the RESURF structure formed on the P-type SOI substrate 100, a depletion layer spreads toward the P-type SOI substrate 100. However, since the vertically spreading depletion layer is interrupted at the interface between the P-type SOI layer 2b and the BOX layer 102, the BOX layer 102 bears electric field because of a boundary condition, so that a high withstand voltage can be ensured.

The dielectric isolation is performed by the BOX layer 102 and the annular trench 11. A parasitic NPN transistor is formed by the N-type semiconductor region and the P-type semiconductor region which are provided on the principal surface of the semiconductor device 1. The operation of the parasitic NPN transistor can be interrupted by the dielectric isolation, so that a high parasitic operation resistance can be implemented.

Figure 23:
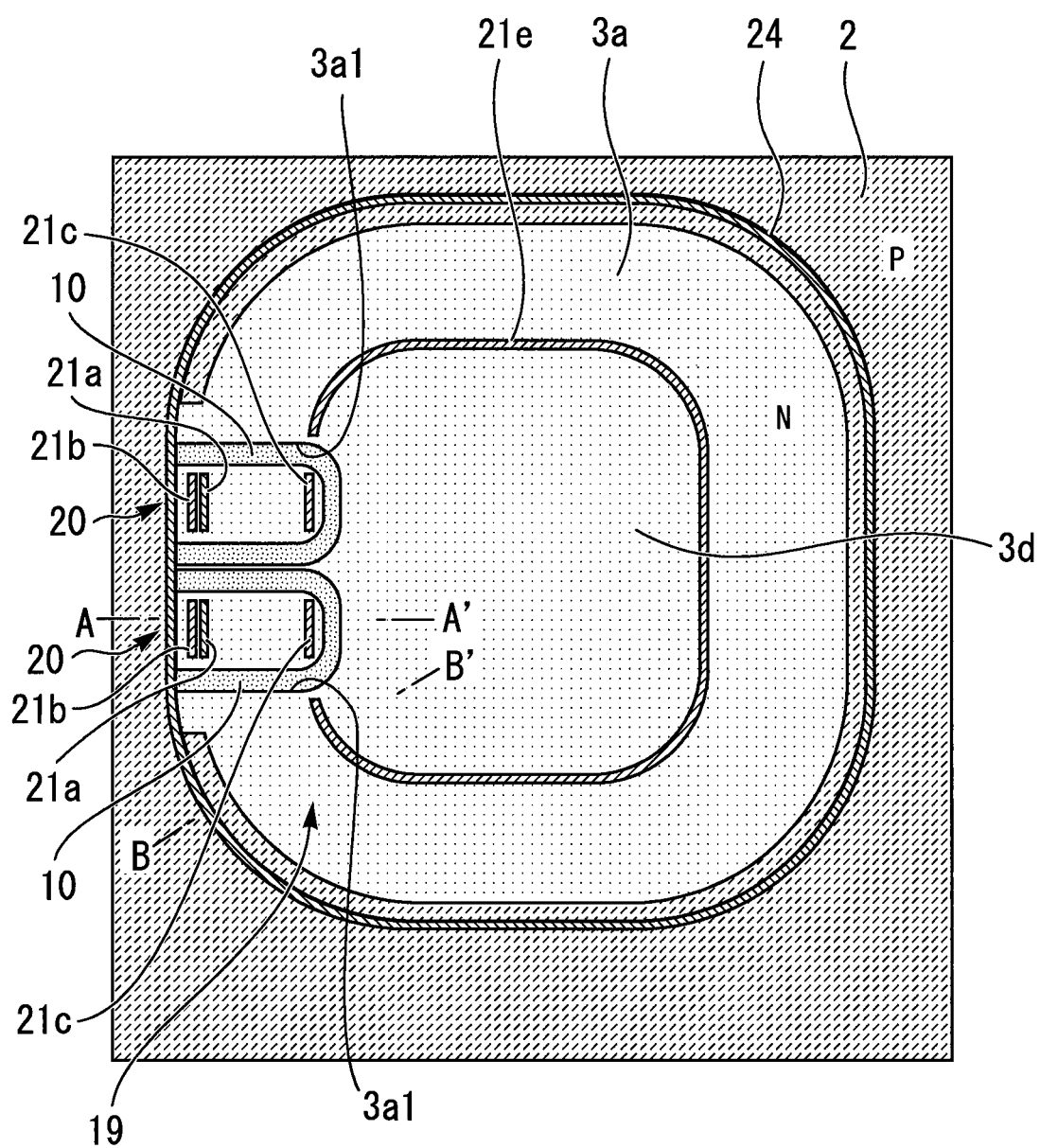
FIG. 23 is a plan view of a semiconductor device according to a related art relating to the embodiment of the present application.
Figure 24:
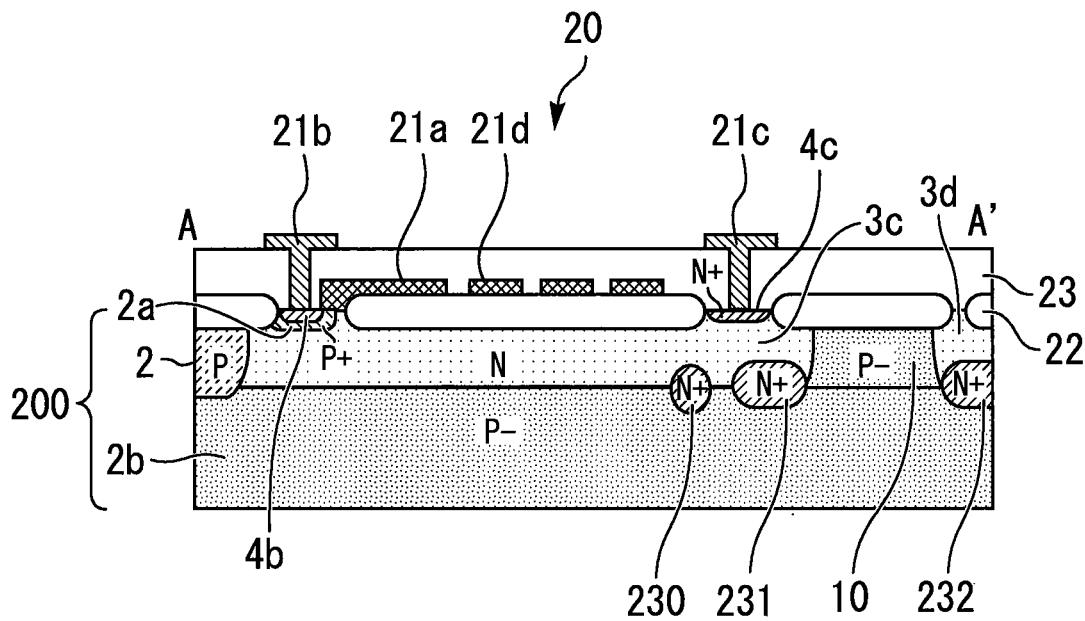
FIG. 24 is a cross-sectional view of a semiconductor device according to a related art relating to the embodiment of the present application.
Figure 25:
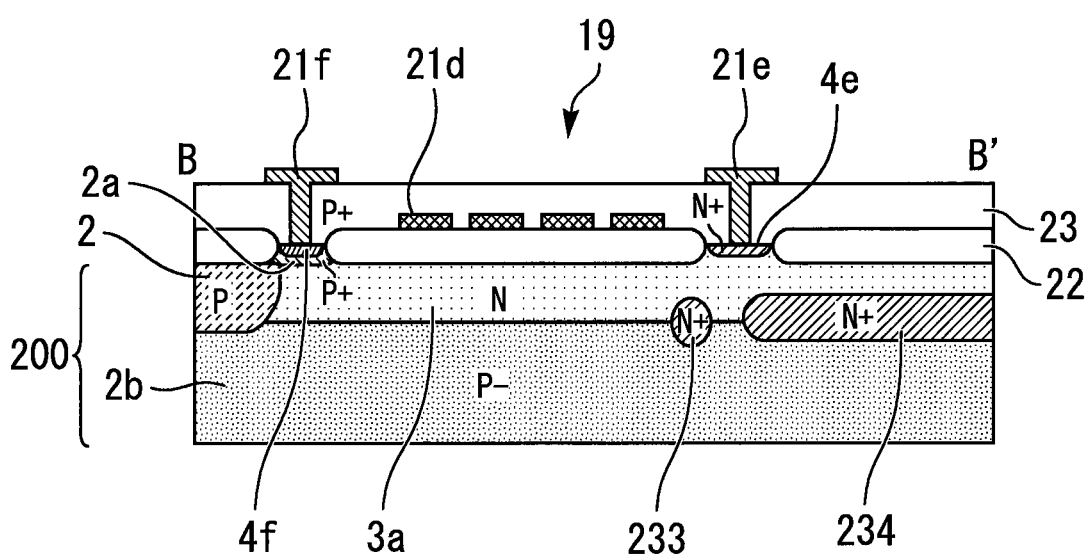
FIG. 25 is a cross-sectional view of a semiconductor device according to a related art relating to the embodiment of the present application.

FIG. 23 is a plan view of a semiconductor device 202 according to a related art relating to the embodiment of the present application. FIGS. 24 and 25 are cross-sectional views of the semiconductor device 202 according to the related art relating to the embodiment of the present application. The semiconductor device 202 according to the related art shown in FIGS. 23 to 25 is different from the first embodiment in that it uses a P-type Si substrate 200. As shown in the cross-sectional views of FIGS. 24 and 25, the semiconductor device 202 is also different from the first embodiment in that N$^+$-type buried regions 230 to 234 are provided on the surface of the P-type Si substrate 200. When the RESURF structure is provided to the P-type Si substrate 200, the depletion layers of the N-type first region 3a (see FIG. 25) and the N-type third region 3c (see FIG. 24) vertically spread from the P-type Si substrate 200 side, whereby electric field can be born in the vertical direction. Therefore, the electric field in the direction parallel to the surface of the P-type Si substrate 200 can be mitigated, and thus a high withstand voltage can be ensured.

Figure 26:
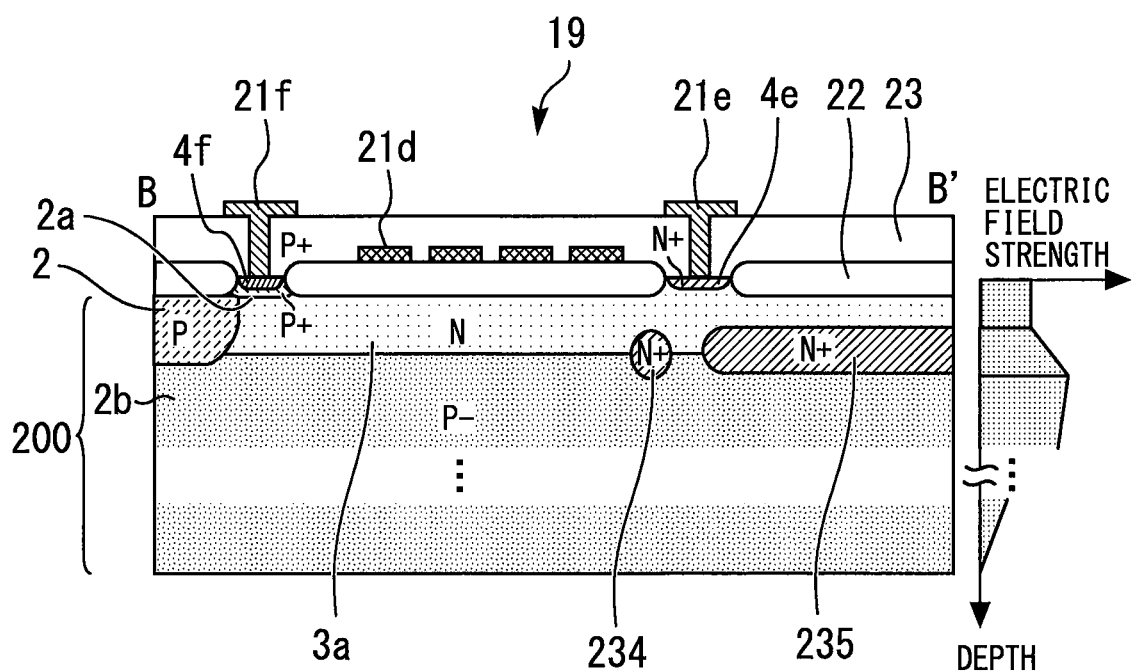
FIG. 26 is a diagram showing the operation of the semiconductor device according to the related art relating to the embodiment of the present application.

FIG. 26 is a diagram showing the operation of the semiconductor device 202 according to the related art relating to the embodiment of the present application. FIG. 26 shows an electric field distribution in the direction vertical to the principal surface of the P-type Si substrate 200. By forming the RESURF structure in the P-type Si substrate 200, the depletion layer can sufficiently spread toward the P-type Si substrate 200, whereby a depth portion of the P-type Si substrate 200 is caused to bear the electric field, so that a high withstand voltage can be ensured.

Comparing the first embodiment with the related art of FIGS. 23 to 26, the RESURF structure is formed, not on the P-type Si substrate 200, but on the P-type SOI substrate 100 in the semiconductor device 1 according to the first embodiment. Furthermore, the dielectric isolation using the BOX layer 102 and the annular trench 11 is performed in the semiconductor device 1 according to the first embodiment. Since the RESURF structure is formed on the P-type Si substrate 200 in the related art shown in FIG. 26, the substrate thickness of the P-type Si substrate 200 increases. On the other hand, the substrate thickness can be suppressed in the first embodiment using the P-type SOI substrate 100. By using the P-type SOI substrate 100, not only a leak current amount under high-temperature operation can be suppressed, but also the dielectric isolation can be achieved by the BOX layer 102 and the annular trench 11. The electrical isolation between the silicon substrate 101 and the N-type second region 3b is enhanced by the dielectric isolation, whereby high malfunction resistance based on suppression of the operation of the parasitic NPN transistor can be achieved.

Figure 27:
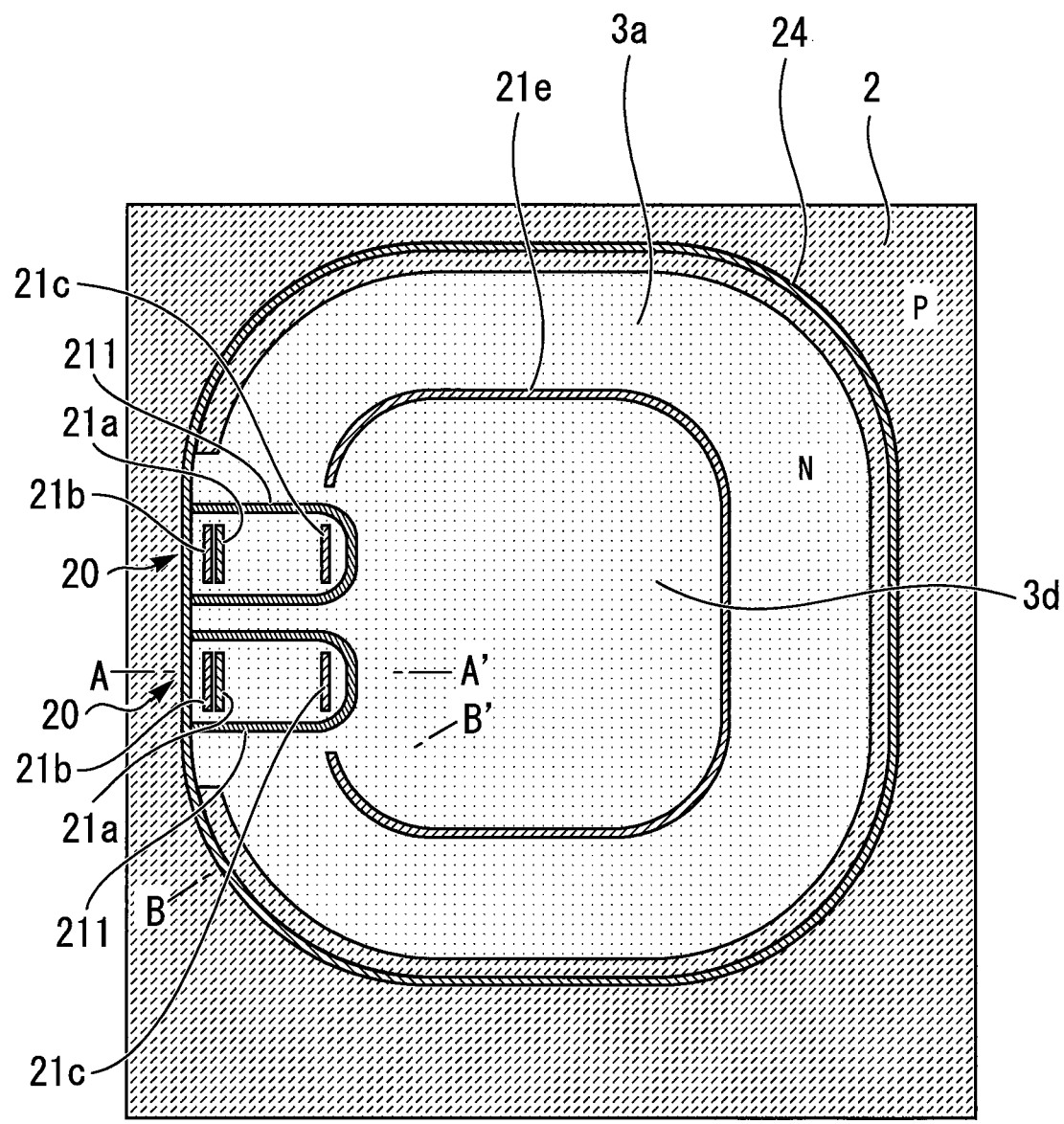
FIG. 27 is a plan view of a semiconductor device according to a related art relating to the embodiment of the present application.

FIG. 27 is a plan view of a semiconductor device 203 according to a related art relating to the embodiment of the present application. In this related art, the P-type isolation region 10 is not provided, and an isolation trench 211 is provided in place of the P-type isolation region 10. When the isolation trench 211 is used in place of the P-type isolation region 10, the spread of the depletion layer becomes unstable. Therefore, a site where depletion delays occurs locally when a high voltage is applied. In connection with the delayed depletion, the related art of FIG. 27 has a problem that leak current caused by concentration of electric field occurs. In order to avoid such a problem, the P-type isolation region 10 is provided in the first embodiment.

Figure 22:
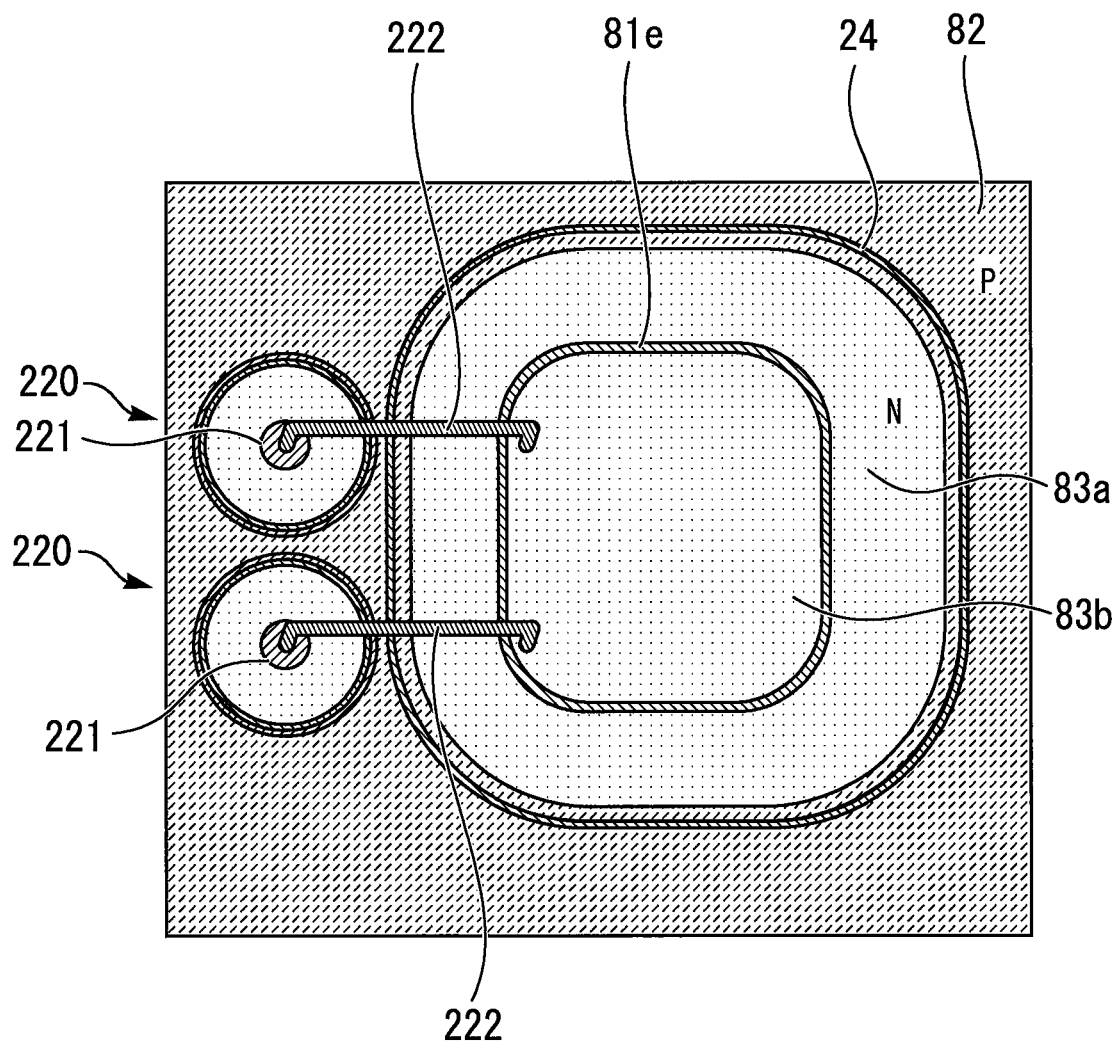
FIG. 22 is a plan view showing a semiconductor device according to a related art related to the present application.

The effect of the first embodiment will be described in more detail. First, by using the P-type SOI substrate 100, the P-type isolation region 10 can be formed without forming a P-type semiconductor layer by doping and diffusing impurities. Here, the difference between a case where a P-type SOI substrate 100 is used and a case where an N-type SOI substrate is used will be described. When the N-type SOI substrate is used, the P-type isolation region 10 is formed by forming a P-type diffusion region with doping and diffusion of impurities. In this case, since it is impossible to form the P-type isolation region 10 by a uniform P-type semiconductor layer, a high electrical isolation function cannot be achieved. Realistically, when the N-type SOI substrate is used, a level-shift device 220 must be provided outside the outer periphery of the high withstand-voltage isolation region 83a as shown in FIG. 22. Accordingly, when the N-type SOI substrate is used, the high withstand-voltage isolation region 83a and the level-shift device 220 are greatly away from each other in a plane direction, and thus there is a problem that the chip size increases. In this point, since the P-type SOI substrate 100 is used in the first embodiment, a uniform P-type isolation region 10 can be formed. When the P-type SOI substrate 100 is used, the N-type first region 3a and the N-type third region 3c are provided by forming the N-type semiconductor region with doping and diffusion of impurities, and also a portion which has been left as the P-type semiconductor between the N-type first region 3a and the N-type third region 3c can be used as the P-type isolation region 10. As a result, the chip size can be dramatically reduced in the semiconductor device 1 according to the first embodiment.

When viewed in plan view of FIG. 2, the first isolation portion 10a of the P-type isolation region 10 electrically isolates the N-type second region 3b and the N-type third region 3c from each other. Therefore, the first isolation portion 10a can isolate the level-shift device 20 from the N-type second region 3b which is a high potential region. Furthermore, the second isolation portion 10b of the P-type isolation region 10 electrically isolates the N-type first region 3a and the N-type third region 3c from each other. Therefore, the second isolation portion 10b can suppress an electrical signal of the level-shift device 20 from being transmitted to N-type first region 3a and the level-shift device 20 adjacent thereto. Furthermore, when viewed in cross-sectional view of FIG. 3, the dielectric isolation is realized by the annular trench 11 and the BOX layer 102. According to the dielectric isolation structure as described above, the operation of the parasitic NPN transistor can be interrupted.

By combining the foregoing structures, the N-type third region 3c and the concave portion 3a1 of the N-type first region 3a can be electrically isolated, reliably, from each other by the uniform P-type isolation region 10 formed of the P-type SOI layer 2b, so that it is possible to reduce the chip size. Furthermore, the electrical isolation is ensured by the P-type isolation region 10 and the dielectric isolation structure. As a result, it is compatibly possible to reduce the chip size and ensure the electrical isolation in the semiconductor device 1.

Figure 6:
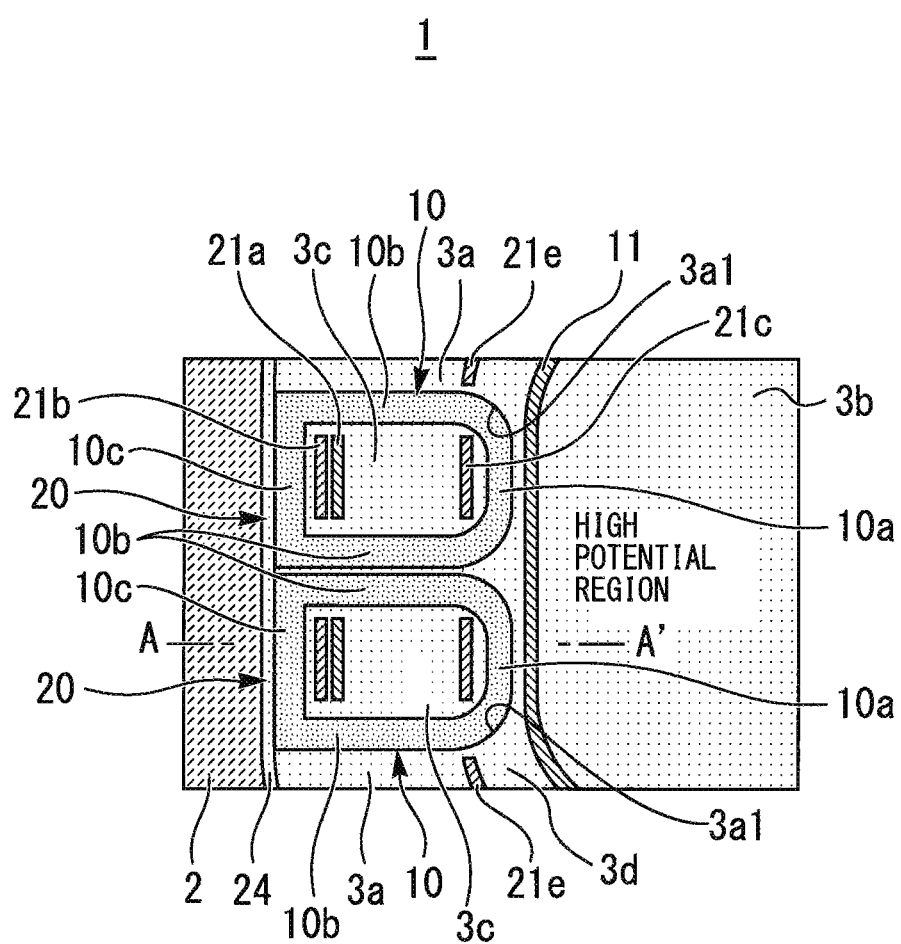
FIG. 6 is a partially enlarged plan view of the semiconductor device according to a modification example of the first embodiment of the present application.

FIG. 6 is a partially enlarged plan view of the semiconductor device 1 according to a modification of the first embodiment of the present application. In this modification, the P-type isolation region 10 is configured in an annular shape, and a third isolation portion 10c extending along the boundary between the P-type low potential region 2 and the N-type third region 3c is added. In the P-type isolation region 10 according to the modification, the electrical isolation between the P-type low potential region 2 and the N-type third region 3c can be ensured by the third isolation portion 10c. The modification shown in FIG. 6 can be applied to each of second to fifth embodiments described later.

Second Embodiment

Figure 7:
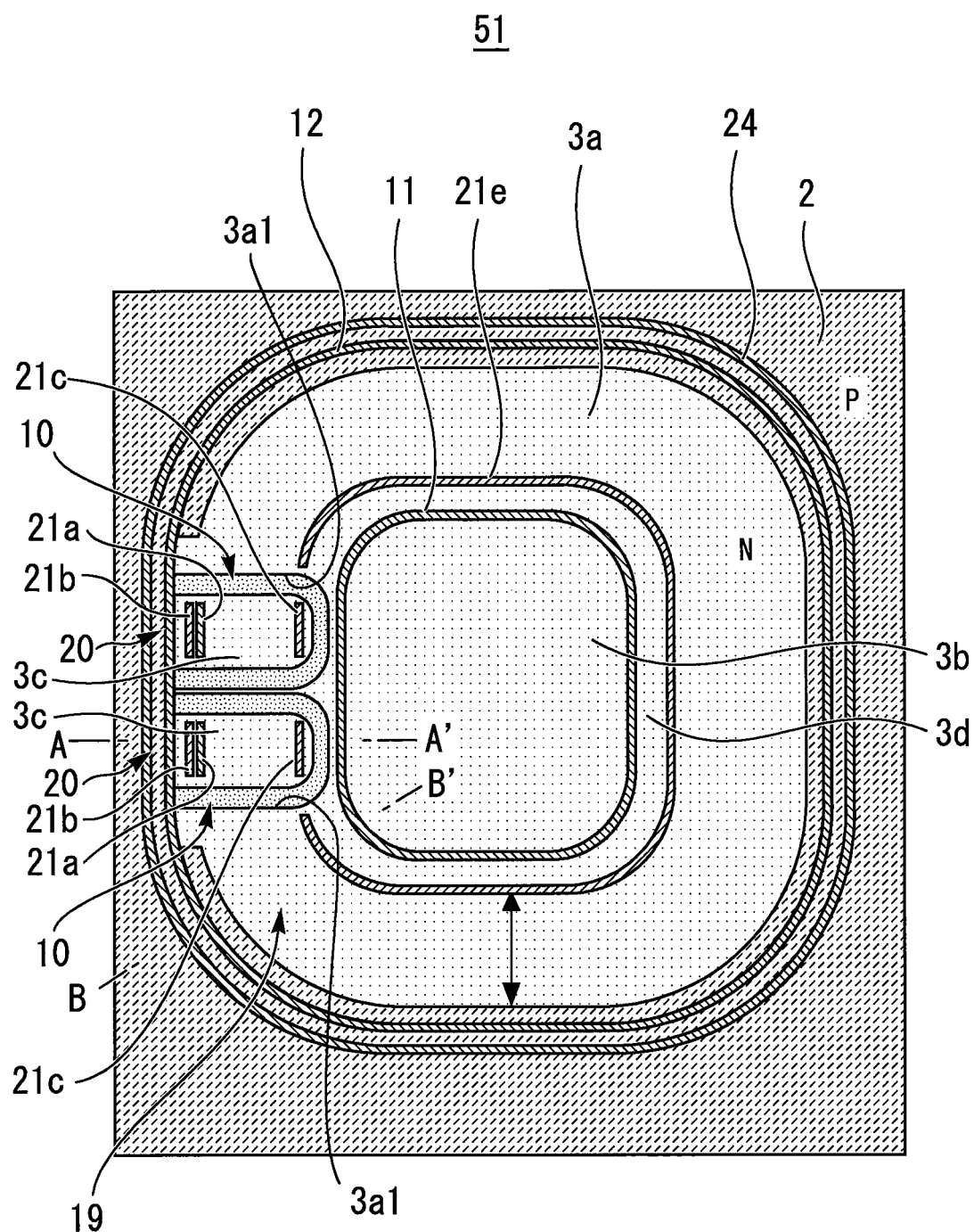
FIG. 7 is a plan view showing a semiconductor device according to a second embodiment of the present application.
Figure 8:
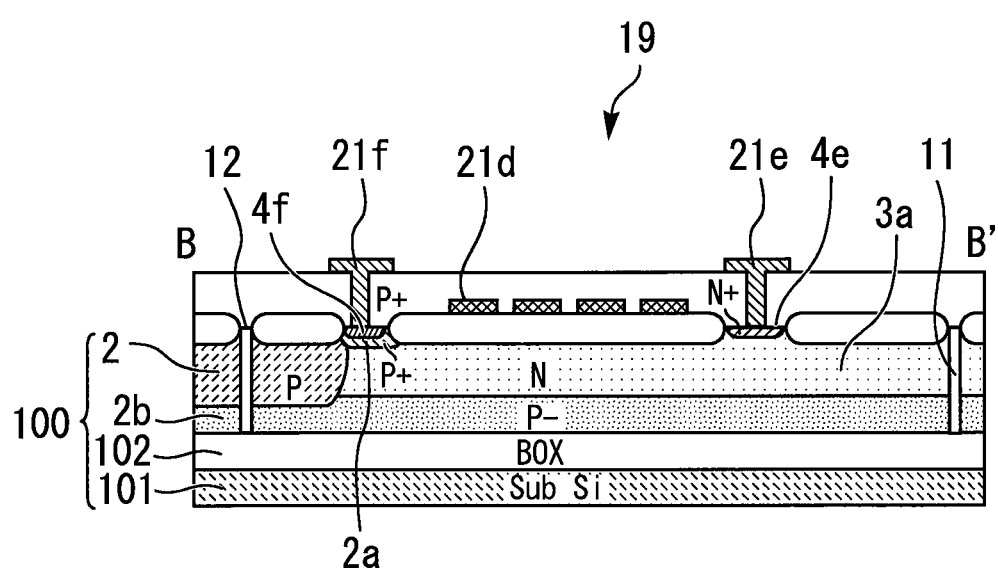
FIG. 8 is a cross-sectional views of the semiconductor device according to the second embodiment of the present application.

FIG. 7 is a plan view of a semiconductor device 51 according to a second embodiment of the present application. FIG. 8 is a cross-sectional view of the semiconductor device 51 according to the second embodiment of the present application. The semiconductor device 51 further includes an annular outer peripheral trench 12. An insulating material is buried in the annular outer peripheral trench 12. In plan view of FIG. 7, the annular outer peripheral trench 12 is provided along the outside of the peripheral edge of the N-type first region 3a and the outside of the level-shift device 20 in the N-type third region 3c. When viewed with the N-type second region 3b located at the center, the annular outer peripheral trench 12 is provided outside the anode electrode 21f as shown in FIG. 8, and also provided inside the ground electrode 24 as shown in FIG. 7. In FIG. 7, only the ground electrode 24 is illustrated, and the anode electrode 21f is omitted from the illustration. In FIG. 8, only the anode electrode 21f is illustrated, and the ground electrode 24 is omitted from the illustration. The annular outer peripheral trench 12 can ensure the electrical isolation between the anode electrode 21f and the ground electrode 24.

Third Embodiment

Figure 9:
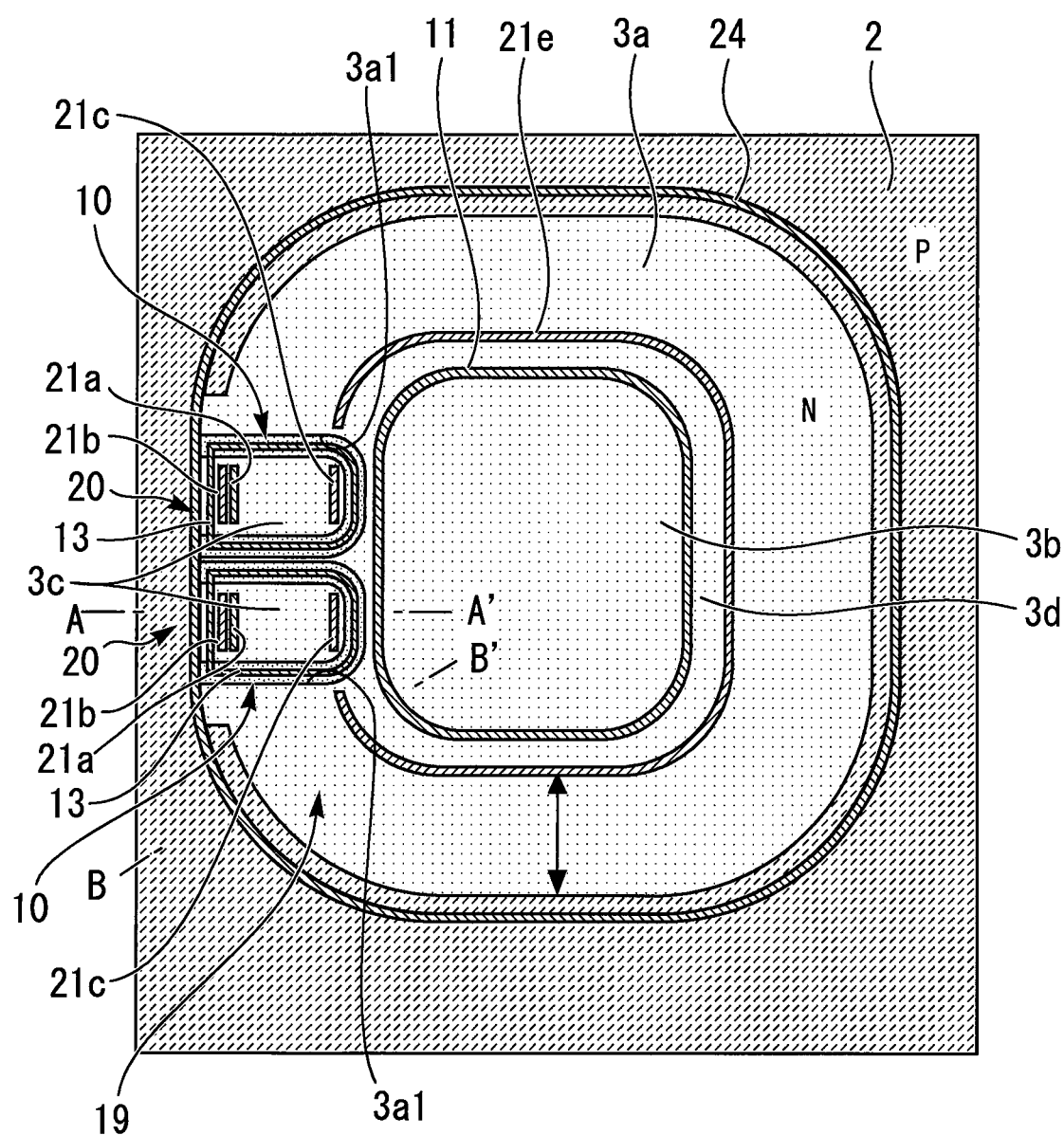
FIG. 9 is a plan view showing a semiconductor device according to a third embodiment of the present application.
Figure 10:
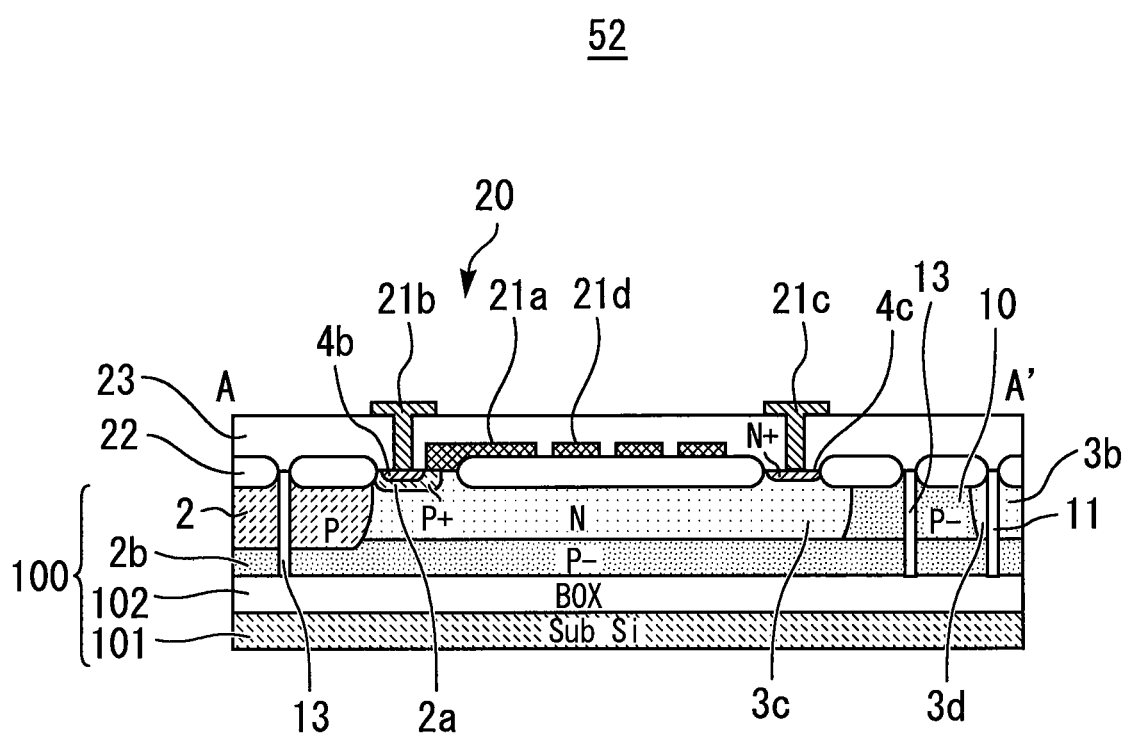
FIG. 10 is a cross-sectional views of the semiconductor device according to the third embodiment of the present application.

FIG. 9 is a plan view of a semiconductor device 52 according to a third embodiment of the present application. FIG. 10 is a cross-sectional view of the semiconductor device 52 according to the third embodiment of the present application. The semiconductor device 52 further includes a trench 13 within the isolation region (hereinafter referred to as "in-isolation-region trench 13"). The in-isolation-region trench 13 extends between the N-type third region 3c and the concave portion 3a1 of the N-type first region 3a in plan view of FIG. 9. The in-isolation-region trench 13 divides the P-type isolation region 10 into an N-type third region 3c side and a concave portion 3a1 side. According to the in-isolation-region trench 13, the electrical isolation function of the P-type isolation region 10 can be enhanced while suppressing occurrence of leak current due to concentration of electrical field.

Both the in-isolation-region trench 13 according to the third embodiment and the annular outer peripheral trench 12 according to the second embodiment may be applied to the semiconductor 1 according to the first embodiment or the modification thereof.

Fourth Embodiment

[Device of Fourth Embodiment]

Figure 11:
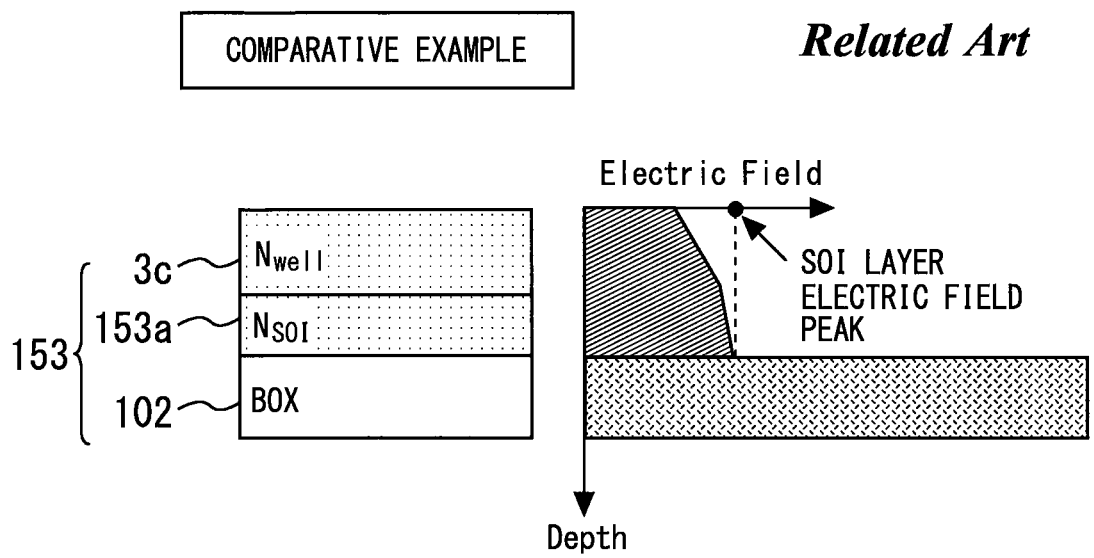
FIG. 11 is a diagram showing the operation and effect of a semiconductor device according to a comparative example of a fourth embodiment of the present application.
Figure 12:
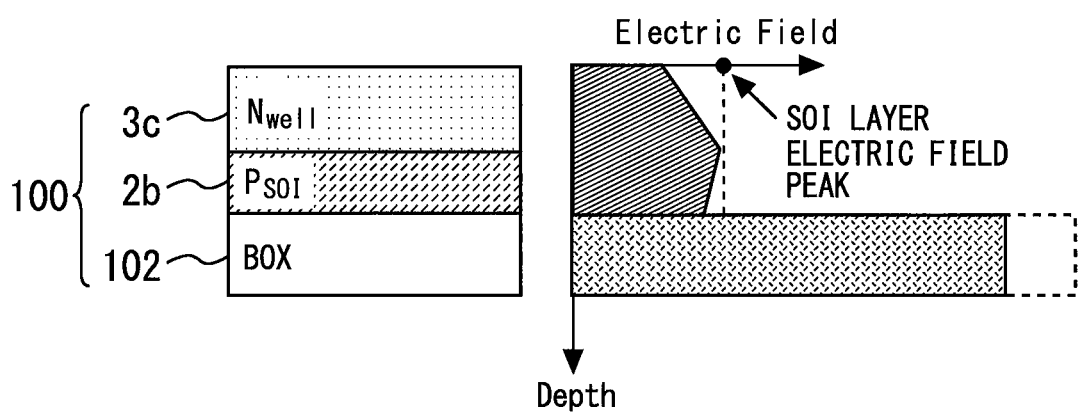
FIG. 12 is a diagram showing the operation and effect of a semiconductor device according to the fourth embodiment of the present application.

FIG. 11 is a diagram showing the operation and effect of a semiconductor device according to a comparative example of a fourth embodiment of the present application. FIG. 12 is a diagram showing the operation and effect of a semiconductor device 53 according to the fourth embodiment of the present application. FIG. 11 is a diagram showing an electrical field distribution in a substrate thickness direction in an N-type SOI substrate 153 having an N-type SOI layer 153a and an N-type third region 3c provided to the N-type SOI layer 153a. FIG. 12 is a diagram showing an electrical field distribution in a substrate thickness direction in the P-type SOI substrate 100 having the N-type third region 3c. By providing the RESURF structure in the SOI substrate, electrical field can be made to be born in the vertical direction to the SOI substrate. In this case, the SOI layer and the BOX layer 102 bear the electrical field. The withstand voltage is determined by a voltage at which the maximum value of the electrical field intensity born by the SOI layer reaches critical breaking electrical field of Si.

A dotted line shown in an electric field intensity distribution of the BOX layer 102 in FIG. 12 represents a difference from the electric field intensity distribution of the BOX layer 102 in the N-type SOI substrate 153 shown in FIG. 11. As is apparent from the comparison between FIG. 11 and FIG. 12, the withstand voltage is lower in the case of use of the P-type SOI substrate 100 than that in the case of use of N-type SOI substrate 153. Therefore, in the fourth embodiment, a high withstand voltage is ensured for even the P-type SOI substrate 100 by providing an N-type buried diffusion region 103 as described below.

Figure 13:
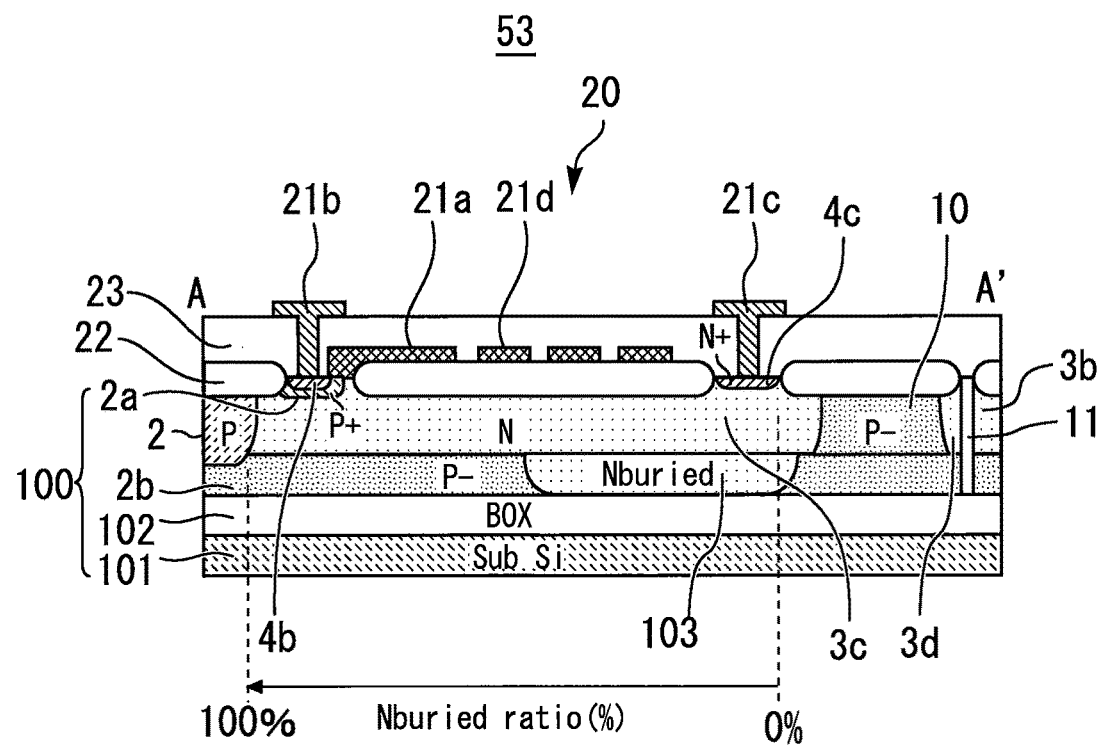
FIG. 13 is a cross-sectional views of the semiconductor device according to the fourth embodiment of the present application.
Figure 14:
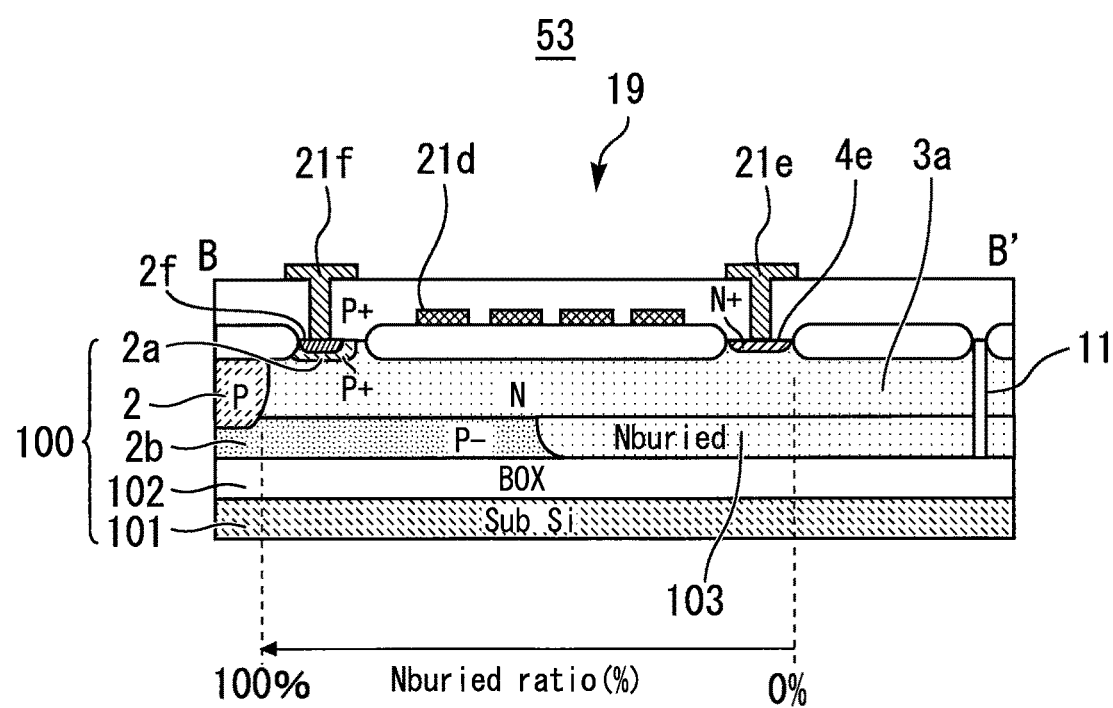
FIG. 14 is a cross-sectional views of the semiconductor device according to the fourth embodiment of the present application.

FIGS. 13 and 14 are cross-sectional views of the semiconductor device 53 according to the fourth embodiment of the present application. The semiconductor device 53 has the same configuration as the semiconductor device 1 according to the first embodiment except that the N-type buried diffusion region 103 is provided. As shown in FIGS. 13 and 14, the N-type buried diffusion region 103 is provided just below the N-type third region 3c and just below the N-type first region 3a. The N-type buried diffusion region 103 penetrates through the P-type SOI layer 2b, and is interposed between each of the N-type first region 3a and the N-type third region 3c and the BOX layer 102. By providing the N-type buried diffusion region 103, the electric field load which the P-type SOI layer 2b bears is mitigated, thereby increasing the withstand voltage.

Figure 15:
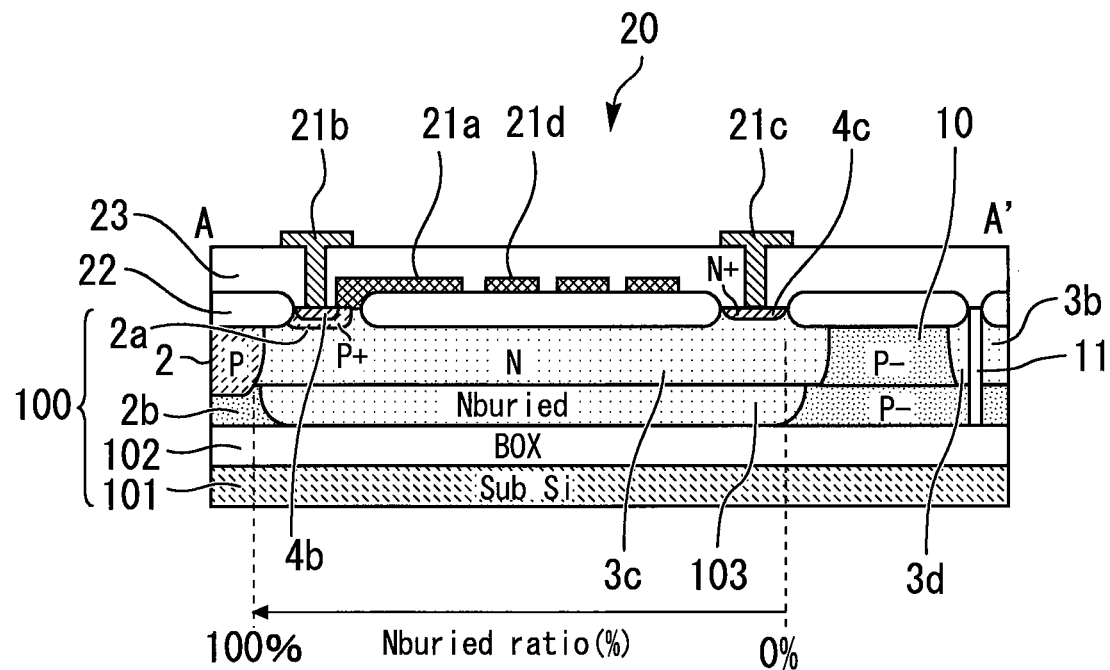
FIG. 15 is a cross-sectional views of the semiconductor device according to a modification example of the fourth embodiment of the present application.

FIG. 15 is a cross-sectional view showing a modification of the semiconductor device 53 according to the fourth embodiment of the present application. The N-type buried diffusion region 103 is provided so as to extend from the boundary between the P-type low potential region 2 and the N-type third region 3c to one end of the N-type third region 3c on an opposite side to the boundary. That is, one end of the N-type buried diffusion region 103 is positioned just below the boundary between the P-type low potential region 2 and the N-type third region 3c. The other end of the N-type buried diffusion region 103 is located below the drain electrode 21c on the opposite side of the N-type third region 3c to the boundary between the P-type low potential region 2 and the N-type third region 3c. The drain electrode 21c and the cathode electrode 21e are high-potential side electrodes. The lower sides of these high potential side electrodes are sites at which the electric field concentrates most in the semiconductor device 53, and thus it is preferable to provide the N-type buried diffusion region 103 below these high potential side electrodes.

Figure 16:
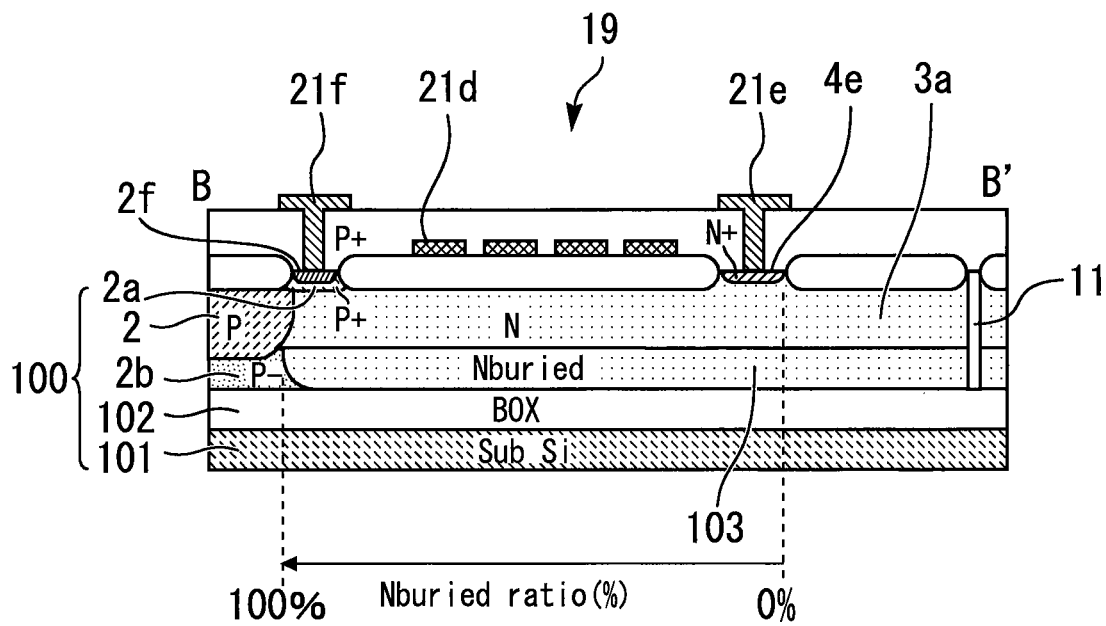
FIG. 16 is a cross-sectional views of the semiconductor device according to a modification example of the fourth embodiment of the present application.

FIG. 16 is a cross-sectional view showing a modification of the semiconductor device 53 according to the fourth embodiment of the present application. One end of the N-type buried diffusion region 103 is positioned just below the boundary between the P-type low potential region 2 and the N-type first region 3a. The other end of the N-type buried diffusion region 103 reaches the annular trench 11.

Figure 17:
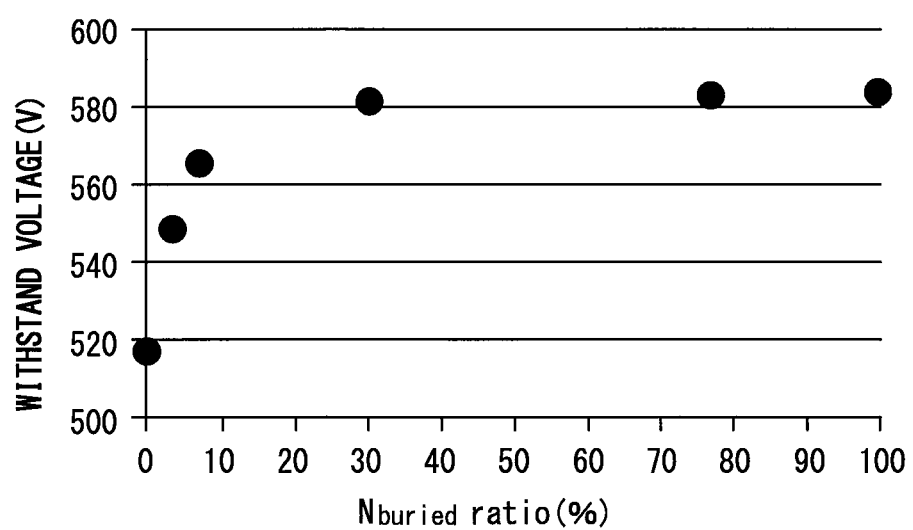
FIG. 17 is a graph showing the modification of the semiconductor device according to the fourth embodiment of the present application.

FIG. 17 is a graph showing the modification of the semiconductor device 53 according to the fourth embodiment of the present application. The N-type buried diffusion region 103 may be provided below the N-type first region 3a and the N-type third region 3c so as to extend unlimitedly to the low potential side insofar as the extension thereof is limited to the position just below the boundary between the P-type low potential region 2 and each of the N-type first region 3a and the N-type third region 3c. FIG. 17 shows a simulation result of the relationship between the size of the N-type buried diffusion region 103 and the withstand voltage. The ordinate axis of FIG. 17 represents the withstand voltage, and the abscissa axis of FIG. 17 represents an N buried ratio. The N buried ratio represents the ratio at which the N-type buried diffusion region 103 spreads to the lower potential side below the N-type first region 3a and the N-type third region 3c. N buried ratio=0% corresponds to a case where there is no N-type buried diffusion region 103. That is, N buried ratio=0% corresponds to the semiconductor device 1 according to the first embodiment. N buried ratio=100% represents the structure that the N-type buried diffusion region 103 extends from the position just below the drain electrode 21c or the cathode electrode 21e to the position just below the end portion of the P-type low potential region 2. That is, N buried ratio=100% corresponds to the structures shown in FIGS. 15 and 16. As the N buried ratio increases from 0%, the N-type buried diffusion region 103 extends more greatly from the position just below the drain electrode 21c or the cathode electrode 21e to the low potential side. It has been confirmed that a withstand voltage increasing effect can be achieved in the range of the N buried ratio from 0% to 100%. The increasing rate of the withstand voltage is high in the N buried ratio range from not less than 0% to not more than 7%, mitigated when the N buried ratio exceeds about 7%, and becomes substantially fixed when the N buried ratio exceeds 30%. Accordingly, for the size of the N-type buried diffusion region 103, it is preferable to set the N buried ratio to 7% or more, and more preferably to set the N buried ratio to 30% or more.

The N-type buried diffusion region 103 may be applied to the semiconductor device 51 according to the modification of the first embodiment and the second embodiment and the semiconductor device 52 according to the third embodiment.

[Manufacturing Method of Fourth Embodiment]

Figure 18:
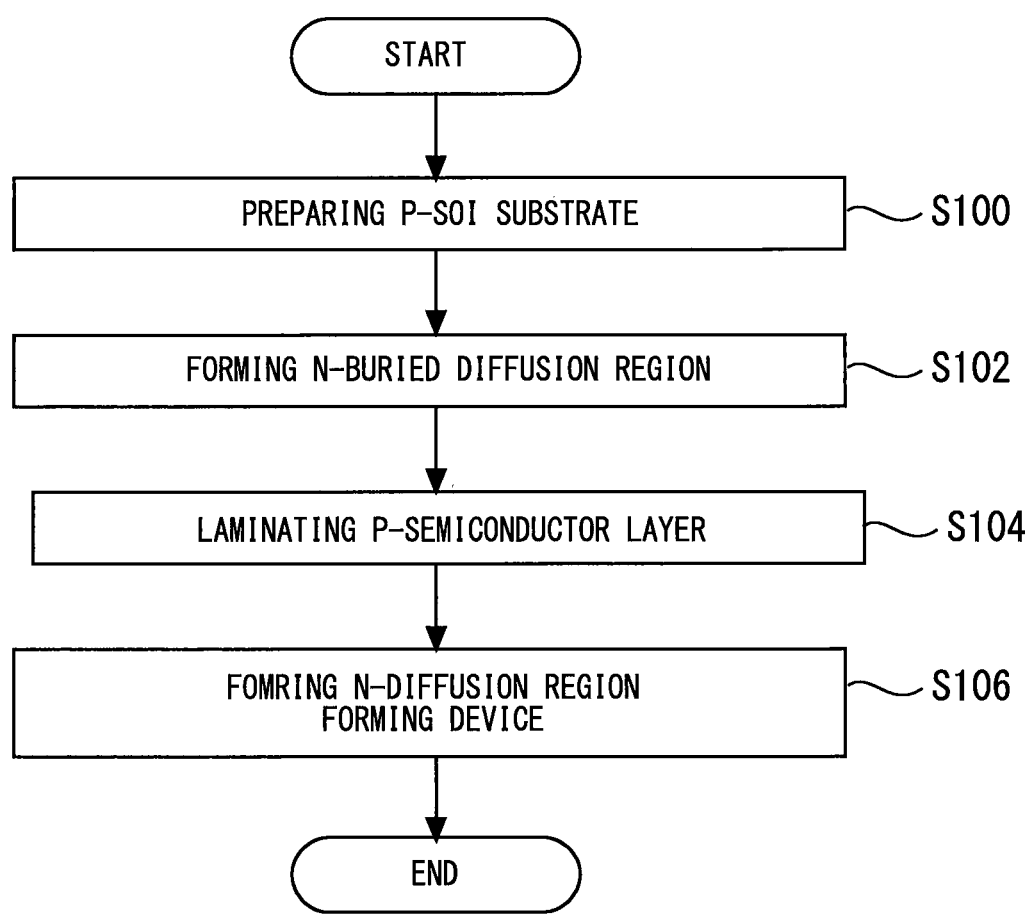
FIG. 18 is a flowchart showing a method of manufacturing the semiconductor device according to the fourth embodiment of the present application.
Figure 19:
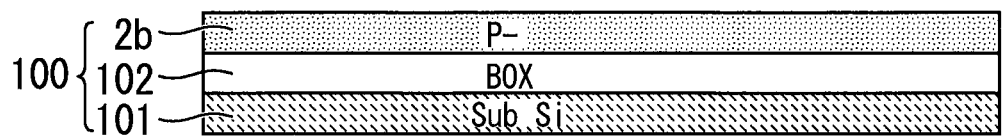
FIG. 19 is a diagram showing the method of manufacturing the semiconductor device according to the fourth embodiment of the present application.
Figure 20:
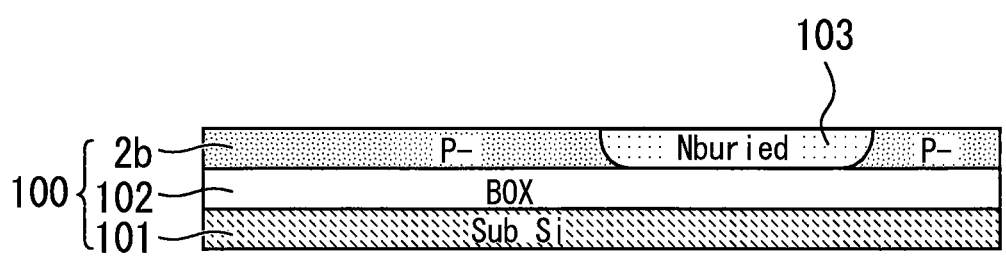
FIG. 20 is a diagram showing the method of manufacturing the semiconductor device according to the fourth embodiment of the present application.
Figure 21:
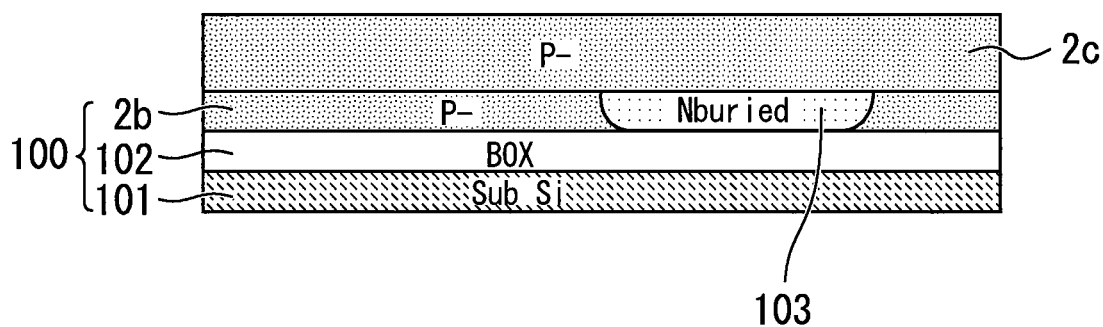
FIG. 21 is a diagram showing the method of manufacturing the semiconductor device according to the fourth embodiment of the present application.

FIG. 18 is a flowchart showing a method of manufacturing the semiconductor device 53 according to the fourth embodiment of the present application. FIGS. 19 to 21 are diagrams showing the method of manufacturing the semiconductor device 53 according to the fourth embodiment of the present application.

In the flowchart of FIG. 18, the P-type SOI substrate 100 shown in FIG. 19 is first prepared (step S100). In the P-type SOI substrate 100, the polarity and concentration of a silicon substrate 101 as a support substrate do not matter. An oxide film having a film thickness which is larger than, for example, 5 µm, is formed on the silicon substrate 101. This oxide film will become the BOX layer 102. A P-type SOI layer 2b having high resistance which is equal to, for example, 80Ω or more is provided on the BOX layer 102 by sticking to the silicon substrate 101. The thickness of the P-type SOI layer 2b is set to be sufficiently smaller than a P-type epitaxial semiconductor layer 2c described later.

Next, the N-type buried diffusion region 103 is provided in a part of the P-type SOI layer 2b (step S102). In step S102, N-type impurities such as P, As, Sb or the like are selectively doped into a site where the N-type buried diffusion region 103 is to be formed while a resist pattern is used. After the doping processing is completed, the resist pattern is removed by cleaning processing or the like.

Next, the P-type epitaxial semiconductor layer 2c is laminated on the other portion of the P-type SOI layer 2b and on the N-type buried diffusion region 103 (step S104). The P-type epitaxial semiconductor layer 2c which will have substrate resistance of the same level as the P-type SOI layer 2b is epitaxially grown on the P-type SOI layer 2b which is formed by sticking.

Next, formation of the N-type diffusion region and the device formation are performed (step S106). In step S106, the N-type diffusion region is selectively formed on the surface of the P-type epitaxial semiconductor layer 2c by impurity doping using a resist pattern, thereby providing the surface structure of the semiconductor devices 1 to 52 described with respect to the first to third embodiments. In addition to the above steps, a well-known insulating film forming step, an electrode forming step, etc. are performed. As a result, the surface structure including the N-type first region 3a having the concave portion 3a1, the annular trench 11, the N-type third region 3c, the level-shift device 20, the P-type isolation region 10, the ground electrode 24, the cathode electrode 21e, etc. is provided on the principal surface of the P-type epitaxial semiconductor layer 2c. The semiconductor device 53 according to the fourth embodiment can be achieved by the foregoing steps.

Fifth Embodiment

Figure 28:
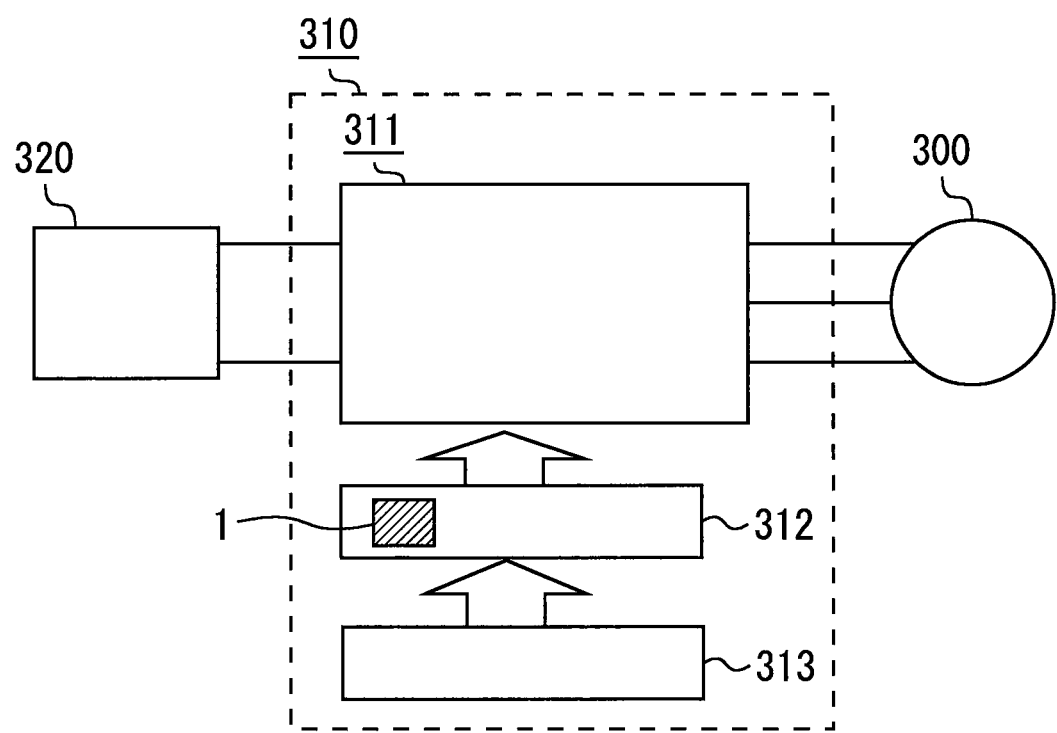
FIG. 28 is a block diagram showing a power conversion device according to a fifth embodiment.

FIG. 28 is a block diagram showing a power conversion device 310 according to a fifth embodiment. FIG. 28 shows the configuration of a power conversion system to which the power conversion device 310 according to the fifth embodiment is applied. In the fifth embodiment, the semiconductor device 1 according to the first embodiment described above is applied to a gate driver IC in a driving circuit 312 equipped to the power conversion device 310. A case where the present application is applied to a three-phase inverter will be described as the fifth embodiment below. However, this is an exemplary embodiment, and the power conversion device 310 can be applied to various kinds of publicly known power conversion devices without being limited to the three-phase inverter.

The power conversion system shown in FIG. 28 includes a power source 320, the power conversion device 310 and a load 300. The power source 320 is a DC power source, and supplies DC power to the power conversion device 310. Various kinds of power sources may be used to configure the power source 320. For example, the power source 320 may be configured by a DC system, a solar battery, a storage battery or the like, or it may be configured by a rectifying circuit or AC/DC converter which is connected to an AC system. Furthermore, the power source 320 may be a DC/DC converter for converting DC power output from a DC system to predetermined power.

The power conversion device 310 is a three-phase inverter connected between the power source 320 and the load 300. The power conversion device 310 converts DC power supplied from the power source 320 to AC power, and supplies the AC power to the load 300. As shown in FIG. 28, the power conversion device 310 includes a main conversion circuit 311 for converting DC power to AC power and then outputting the AC power, a driving circuit 312 for outputting a signal for driving each switching device of the main conversion circuit 311, and a control circuit 313 for outputting a control signal for controlling the driving circuit 312 to the driving circuit 312.

The load 300 is a three-phase electric motor to be driven with AC power supplied from the power conversion device 310. The load 300 is not limited to a special application. The load 300 is an electric motor installed in each kind of electric equipment. The load 300 may be used as an electric motor suitable for a hybrid vehicle, an electric vehicle, a railroad vehicle, an elevator or an air conditioner, for example.

The details of the power conversion device 310 will be described hereunder. The main conversion circuit 311 has a semiconductor switching device (not shown) and a reflux diode (not shown). Upon switching of the semiconductor switching device, DC power supplied from the power source 320 is converted to AC power, and supplied to the load 300. Various kinds of configurations may be adopted as a specific configuration of the main conversion circuit 311. As one example, the main conversion circuit 311 according to the fifth embodiment is a two-level three-phase full bridge circuit. The two-level three-phase full bridge circuit may be configured by six semiconductor switching devices and six reflux diodes which are in anti-parallel connection with the six semiconductor switching devices. Every two semiconductor switching devices of the six semiconductor switching devices are connected in series to each other to configure upper and lower arms, and each pair of upper and lower arms constitutes each phase (U phase, V phase and W phase) of the full bridge circuit. The output terminals of the respective pairs of upper and lower arms, that is, the three output terminals of the main conversion circuit 311 are connected to the load 300.

The driving circuit 312 generates a driving signal for driving the semiconductor switching devices of the main conversion circuit 311. The driving signal is supplied to control electrodes of the semiconductor switching devices of the main conversion circuit 311. Specifically, according to a control signal from a control circuit 313 described later, the driving circuit 312 outputs a driving signal for setting the semiconductor switching device to an ON-state and a driving signal for setting the semiconductor switching device to an OFF-state to the control electrode of each semiconductor switching device. When the semiconductor switching device is kept under the ON-state, the driving signal is a voltage signal which is not less than a threshold voltage of the semiconductor switching device (that is, ON-signal). When the semiconductor switching device is kept under the OFF-state, the driving signal is a voltage signal which is not more than the threshold voltage of the semiconductor switching device (that is, OFF-signal).

The driving circuit 312 contains the semiconductor device 1 of the first embodiment as a gate driver IC. The driving circuit 312 receives the control signal from the control circuit 313. The level-shift device 20 equipped to the semiconductor device 1 performs level shift on this control signal. A driving signal is generated by subjecting the control signal to the level shift. That is, a logic control signal from the control circuit 313 is input to the gate electrode 21a of the level-shift device 20. The logic control signal is subjected to level shift in the level-shift device 20, whereby a logic is transmitted to the high potential side. The logic transmitted to the high potential side finally becomes a driving signal, and is input to the semiconductor switching device of the main conversion circuit 311.

The control circuit 313 controls the semiconductor switching devices of the main conversion circuit 311 so that the load 300 is supplied with desired power. Specifically, a time (ON-time) for which each semiconductor switching device of the main conversion circuit 311 is set to the ON-state is calculated based on power to be supplied to the load 300. For example, the main conversion circuit 311 can be controlled by PWM control for modulating the ON-time of the semiconductor switching device according to a voltage to be output. The control circuit 313 outputs the control signal to the driving circuit 312 so that at each time point, the ON-signal is supplied to a semiconductor switching device which should be set to the ON-state while the OFF-signal is supplied to a semiconductor switching device which should be set to the OFF-state. This control signal is a control command for determining ON/OFF of the semiconductor switching device. As described above, the driving circuit 312 outputs the ON-signal or the OFF-signal as a driving signal to the control electrode of each semiconductor switching device according to the control signal.

In the power conversion device 310 of the fifth embodiment, the semiconductor device 1 according to the first embodiment is used as the gate driver IC of the driving circuit 312. Accordingly, advantages of miniaturization and stable operation of the device can be achieved. The various modifications described with respect to the first embodiment may be applied to the configuration of the semiconductor device 1. Furthermore, in place of the semiconductor device 1, the semiconductor devices 51 to 53 according to the second to fourth embodiments and the modifications thereof may be used as the gate driver IC in the driving circuit 312.

In the fifth embodiment, the power conversion device 310 is the two-level three-phase inverter. However, it is not limited to this device, but various power conversion devices may be used. The power conversion device 310 may be modified to a three-level or multi-level power conversion device in addition to the two-level power conversion device. When power is supplied to a single-phase load, the power conversion device 310 may be a single-phase inverter. When power is supplied to a DC load or the like, the power conversion device 310 may be a DC/DC converter or an AC/DC converter.

The load 300 is not limited to the electric motor. The power conversion device 310 may be connected to, for example, an electric discharge machine, a laser beam machine, an induction heating cooker or a non-contact power supply system to be used as a power supply device for these devices. Furthermore, the power conversion device 310 may be used as a power conditioner for a solar photovoltaic generation system, a power storage system or the like. The configuration of the load 300 is variously modified according to the specific configurations of these various devices.

The features and advantages of the embodiments may be summarized as follows. According to the present application, the electrical isolation between the third region and the first region and the electrical isolation between the third region and the second region can be ensured by using an uniform P-type isolation structure formed of a P-type SOI substrate, and the electrical isolation of the third region can be also ensured by a dielectric isolation structure based on the insulating layer of the P-type SOI substrate and the annular trench. Consequently, the electrical isolation of the level-shift device can be ensured while reducing the chip size.

Obviously many modifications and variations of the present invention are possible in the light of the above teachings.

It is therefore to be understood that within the scope of the appended claims the invention may be practiced otherwise than as specifically described.

The entire disclosure of Japanese Patent Application No. 2017-096561, filed on May 15, 2017 including specification, claims, drawings and summary, on which the Convention priority of the present application is based, is incorporated herein by reference in its entirety.

The invention claimed is:

1. A semiconductor device comprising:
a P-type SOI substrate having an insulating layer and a P-type SOI layer laminated on the insulating layer;
an N-type first region that is provided on a principal surface of the P-type SOI layer and has a concave portion at which a part of a peripheral edge of the N-type first region is concaved in a plane direction of the principal surface of the P-type SOI layer in plan view of the principal surface of the P-type SOI layer;
an annular trench that is annularly provided in a center region of the N-type first region in plan view of the principal surface of the P-type SOI layer so as to reach the insulating layer of the P-type SOI substrate, and filled with an insulating material therein;
an N-type second region that is provided inside the annular trench in plan view of the principal surface of the P-type SOI layer;
an N-type third region that is provided inside the concave portion of the N-type first region so as to be away from an edge of the concave portion in plan view of the principal surface of the P-type SOI layer, and in which a level-shift device is formed; and
a P-type isolation region that extends along a boundary between the N-type third region and the concave portion of the N-type first region in plan view of the principal surface of the P-type SOI layer, and includes a first isolation portion interposed between the N-type second region and the N-type third region, and a second isolation portion interposed between the N-type first region and the N-type third region.

2. The semiconductor device according to claim 1, wherein the N-type first region includes a plurality of concave portions, and the N-type third region, the level-shift device and the P-type isolation region are provided to each of the plurality of concave portions.

3. The semiconductor device according to claim 2, wherein the P-type isolation region is annular in plan view of the principal surface of the P-type SOI layer.

4. The semiconductor device according to claim 3, further comprising an annular outer peripheral trench that is provided along a peripheral edge of the N-type first region and an outside of the level-shift device in the N-type third region in plan view of the principal surface of the P-type SOI layer, and filled with an insulating material therein.

5. The semiconductor device according to claim 2, further comprising an annular outer peripheral trench that is provided along a peripheral edge of the N-type first region and an outside of the level-shift device in the N-type third region in plan view of the principal surface of the P-type SOI layer, and filled with an insulating material therein.

6. The semiconductor device according to claim 2, further comprising an in-isolation-region trench that extends between the N-type third region and the N-type first region in plan view of the principal surface of the P-type SOI layer so as to divide the P-type isolation region into a third-region side and a first-region side, and is filled with an insulating material therein.

7. The semiconductor device according to claim 2, further comprising an N-type buried diffusion layer that penetrates through the P-type SOI layer and is interposed between at least one region of the N-type third region and the N-type first region and the insulating layer of the P-type SOI substrate.

8. The semiconductor device according to claim 1, wherein the P-type isolation region is annular in plan view of the principal surface of the P-type SOI layer.

9. The semiconductor device according to claim 8, further comprising an annular outer peripheral trench that is provided along a peripheral edge of the N-type first region and an outside of the level-shift device in the N-type third region in plan view of the principal surface of the P-type SOI layer, and filled with an insulating material therein.

10. The semiconductor device according to claim 8, further comprising an in-isolation-region trench that extends between the N-type third region and the N-type first region in plan view of the principal surface of the P-type SOI layer so as to divide the P-type isolation region into a third-region side and a first-region side, and is filled with an insulating material therein.

11. The semiconductor device according to claim 8, further comprising an N-type buried diffusion layer that penetrates through the P-type SOI layer and is interposed between at least one region of the N-type third region and the N-type first region and the insulating layer of the P-type SOT substrate.

12. The semiconductor device according to claim 1, further comprising an annular outer peripheral trench that is provided along a peripheral edge of the N-type first region and an outside of the level-shift device in the N-type third region in plan view of the principal surface of the P-type SOI layer, and filled with an insulating material therein.

13. The semiconductor device according to claim 12, further comprising an in-isolation-region trench that extends between the N-type third region and the N-type first region in plan view of the principal surface of the P-type SOI layer so as to divide the P-type isolation region into a third-region side and a first-region side, and is filled with an insulating material therein.

14. The semiconductor device according to claim 12, further comprising an N-type buried diffusion layer that penetrates through the P-type SOI layer and is interposed between at least one region of the N-type third region and the N-type first region and the insulating layer of the P-type SOT substrate.

15. The semiconductor device according to claim 1, further comprising an in-isolation-region trench that extends between the N-type third region and the N-type first region in plan view of the principal surface of the P-type SOI layer so as to divide the P-type isolation region into a third-region side and a first-region side, and is filled with an insulating material therein.

16. The semiconductor device according to claim 15, further comprising an N-type buried diffusion layer that penetrates through the P-type SOI layer and is interposed between at least one region of the N-type third region and the N-type first region and the insulating layer of the P-type SOT substrate.

17. The semiconductor device according to claim 1, further comprising an N-type buried diffusion layer that penetrates through the P-type SOI layer and is interposed between at least one region of the N-type third region and the N-type first region and the insulating layer of the P-type SOT substrate.

18. The semiconductor device according to claim 17, further comprising a P-type fourth region that is provided on the principal surface of the P-type SOI layer so as to surround the N-type first region, the P-type isolation region and the N-type third region, and has a higher impurity concentration than the P-type SOI layer, wherein the N-type third region has a high potential side electrode at the first-region side, the N-type buried diffusion layer is interposed between the N-type third region and the insulating layer of the P-type SOI substrate, and the N-type buried diffusion layer extends from a position just below a boundary between the P-type fourth region and the N-type third region to a position just below the high potential side electrode.

19. A power conversion device comprising:
- a main conversion circuit that has a semiconductor switching device, converts input power by the semiconductor switching device and outputs the converted input power;
- a driving circuit that outputs a driving signal for driving the semiconductor switching device to the semiconductor switching device; and
- a control circuit for outputting a control signal for controlling the driving circuit to the driving circuit, wherein the driving circuit contains a semiconductor device, wherein the semiconductor device comprises:
- a P-type SOI substrate having an insulating layer and a P-type SOI layer laminated on the insulating layer;
- an N-type first region that is provided on a principal surface of the P-type SOI layer and has a concave portion at which a part of a peripheral edge of the N-type first region is concaved in a plane direction of the principal surface of the P-type SOI layer in plan view of the principal surface of the P-type SOI layer;
- an annular trench that is annularly provided in a center region of the N-type first region in plan view of the principal surface of the P-type SOI layer, an inside of the annular trench being filled with an insulating material and reaching the insulating layer of the P-type SOI substrate;
- an N-type second region that is provided inside the annular trench in plan view of the principal surface of the P-type SOI layer;
- an N-type third region that is provided inside the concave portion of the N-type first region so as to be away from an edge of the concave portion in plan view of the principal surface of the P-type SOI layer, and in which a level-shift device is formed; and
- a P-type isolation region that extends along a boundary between the N-type third region and the concave portion of the N-type first region and includes a first isolation portion interposed between the N-type second region and the N-type third region and a second isolation portion interposed between the N-type first region and the N-type third region, and the driving circuit performs level shift on the control signal by the level-shift device to generate the driving signal.

* * * * *